United States Patent
Ohashi et al.

(10) Patent No.: US 10,554,192 B2
(45) Date of Patent: Feb. 4, 2020

(54) ACOUSTIC WAVE DEVICE AND ELECTRONIC COMPONENT

(71) Applicant: KYOCERA CORPORATION, Kyoto (JP)

(72) Inventors: Yasutaka Ohashi, Nara (JP); Satoshi Asai, Souraku-gun (JP); Masaru Nagata, Kyotanabe (JP)

(73) Assignee: KYOCERA CORPORATION, Kyoto (JP)

( * ) Notice: Subject to any disclaimer, the term of this patent is extended or adjusted under 35 U.S.C. 154(b) by 367 days.

(21) Appl. No.: 15/406,427

(22) Filed: Jan. 13, 2017

(65) Prior Publication Data

US 2017/0207767 A1 Jul. 20, 2017

Related U.S. Application Data

(63) Continuation of application No. 14/239,768, filed as application No. PCT/JP2012/071181 on Aug. 22, 2012, now Pat. No. 9,548,437.

(30) Foreign Application Priority Data

Aug. 22, 2011 (JP) ................................ 2011-180265
Oct. 31, 2011 (JP) ................................ 2011-239314
May 30, 2012 (JP) ................................ 2012-122994

(51) Int. Cl.
*H03H 9/12* (2006.01)
*H01L 41/04* (2006.01)
(Continued)

(52) U.S. Cl.
CPC ......... *H03H 9/1092* (2013.01); *H01L 41/047* (2013.01); *H01L 41/0475* (2013.01);
(Continued)

(58) Field of Classification Search
CPC . H01L 41/047; H01L 41/0475; H01L 41/053; H01L 41/0533; H03H 9/02992; H03H 9/105; H03H 9/171
(Continued)

(56) References Cited

U.S. PATENT DOCUMENTS 8,963,655 B2 2/2015 Ookubo
2004/0108791 A1 6/2004 Kadota et al.
(Continued)

FOREIGN PATENT DOCUMENTS

JP H10-163647 A 6/1998
JP 2001-274271 A 10/2001
(Continued)

OTHER PUBLICATIONS

Office Action in related Japanese Patent Application No. JP 2010-550237, dated Dec. 25, 2012, and Statement of Relevance in 5 pages, Statement of Relevance.
(Continued)

*Primary Examiner* — Derek J Rosenau
(74) *Attorney, Agent, or Firm* — Duane Morris LLP

(57) ABSTRACT

An acoustic wave device and an electronic component are disclosed. The acoustic wave device includes a substrate, excitation electrodes on the substrate and a cover. The cover comprises a frame member on the substrate, and a lid member. The frame member surrounds the excitation electrodes and includes an inner wall, top surface and an outer wall. The lid member is disposed on the top surface, and includes first and second surfaces opposite to each other, and a descending part on the second surface. The second surface faces the substrate. The descending part extends downward from the second surface, and covers at least a part of the inner wall or at least a part of the outer wall. The electronic component includes the acoustic wave device on a mounting
(Continued)

substrate via an electrically conductive bonding member, and molding resin covering the device.

16 Claims, 24 Drawing Sheets

(51) Int. Cl.
*H01L 41/053* (2006.01)
*H03H 9/10* (2006.01)
*H01L 41/047* (2006.01)
*H03H 9/02* (2006.01)
*H03H 9/17* (2006.01)

(52) U.S. Cl.
CPC ..... *H01L 41/0533* (2013.01); *H03H 9/02992* (2013.01); *H03H 9/105* (2013.01); *H03H 9/171* (2013.01)

(58) Field of Classification Search
USPC ........................................................ 310/348
See application file for complete search history.

(56) References Cited

U.S. PATENT DOCUMENTS

| | | | | |
|---|---|---|---|---|
| 2007/0075606 | A1* | 4/2007 | Inoue | ................ H03H 3/08 310/313 R |
| 2010/0225202 | A1 | 9/2010 | Fukano et al. | |
| 2011/0115339 | A1 | 5/2011 | Makibuchi et al. | |
| 2011/0118339 | A1* | 5/2011 | Manoharan | ........ A61K 31/7115 514/44 R |
| 2011/0221546 | A1 | 9/2011 | Yamaji et al. | |
| 2012/0182091 | A1 | 7/2012 | Ookubo | |

FOREIGN PATENT DOCUMENTS

| | | | |
|---|---|---|---|
| JP | 2003-133465 | A | 5/2003 |
| JP | 2007-318058 | | 12/2007 |
| JP | 2007-318058 | A | 12/2007 |
| JP | 2008-182292 | A | 8/2008 |
| JP | 2008-227748 | A | 9/2008 |
| JP | 2009-267484 | A | 11/2009 |
| JP | 2010-200198 | | 9/2010 |
| JP | 2010-278971 | A | 12/2010 |
| JP | 2010-278972 | A | 12/2010 |
| WO | WO 2009/057699 | A1 | 10/2008 |
| WO | WO 2009/157587 | | 6/2009 |
| WO | 2011065499 | A1 | 6/2011 |

OTHER PUBLICATIONS

Office Action in related Japanese Patent Application No. JP 2013-026324, dated Aug. 25, 2015, and Statement of Relevance in 5 pages, Statement of Relevance.

\* cited by examiner

ACOUSTIC WAVE DEVICE AND ELECTRONIC COMPONENT

RELATED APPLICATIONS

This application is a continuation application of U.S. application Ser. No. 14/239,768 entitled "Acoustic Wave Device and Electronic Component" filed on Feb. 19, 2014, the content of which is incorporated herein in its entirety.

FIELD OF ART

The present invention relates to an acoustic wave device such as surface acoustic wave (SAW) device or piezoelectric thin-film resonator (FBAR: film bulk acoustic resonator), and to an electronic component using such a device.

BACKGROUND ART

A so-called wafer-level package (WLP) type acoustic wave device directed at achieving compactness is known. This WLP type acoustic wave device has a piezoelectric substrate, excitation electrodes provided on the piezoelectric substrate, and a cover sealing the excitation electrodes (refer to, for example, Patent Reference 1).

The cover is formed by an annular frame member surrounding the excitation electrodes disposed on the upper surface of the piezoelectric substrate and a lid member disposed on the upper surface of the frame member so as to cover the aperture of the frame member. The lid member covering the aperture of the frame member in this manner establishes an oscillation space above the excitation electrodes, which is a region surrounded by the inner wall of the frame member and the lower surface of the lid member.

Although the frame member and lid member making up the cover are often formed from the same material, there are cases in which a small gap is formed between the frame member and the lid member in the case, for example, of the frame member and the lid member being formed by separate processes.

If a gap is formed between the frame member and the lid member, a linking of the outside of the cover and the oscillation space via the gap changes the atmosphere within the oscillation space. Water from the outside air entering the oscillation space via the gap can cause corrosion of the excitation electrodes. If the excitation electrodes corrode, the electrical characteristics of the acoustic wave device deteriorate.

Given the above, it is desirable to provide an acoustic wave device that, even if the cover is formed by a frame member and a lid member, can maintain airtightness of the oscillation space over a long period of time.

CITATION LIST

Patent Literature

Patent Reference 1: Japanese patent application publication 2008-227748

SUMMARY OF INVENTION

According to an aspect of the present invention, an acoustic wave device includes an element substrate, excitation electrodes disposed on a main surface of the element substrate, and a cover including: a frame member disposed on the main surface of the element substrate so as to surround the excitation electrodes; and a lid member that closes over the frame member by overlapping the frame member, and that includes a descending part covering at least a part of an inner wall or an outer wall of the frame member by continuing from an upper side of the inner wall or from an upper side of the outer wall.

According to another aspect of the present invention, an acoustic wave device includes an element substrate, excitation electrodes disposes on a main surface of the element substrate, and a cover including: a frame member disposed on the main surface of the element substrate so as to surround the excitation electrodes; and a lid member that closes over the frame member by overlapping the frame member, wherein the frame member includes a frame member side protruding and recessed part on the upper surface thereof, and the lid member includes a lid member side protruding and recessed part on a lower surface thereof, the lid member side protruding and recessed part fits in the frame member side protruding and recessed part.

According to a further aspect of the present invention, an electronic component includes a mounting substrate, the abovementioned acoustic wave device mounted via an electrically conductive bonding member in a condition in which a main surface of the element substrate faces a main surface of the mounting substrate, and molding resin covering the acoustic wave device.

Since the acoustic wave device having the above-noted constitution is provided with a descending part covering at least a part of the inner wall of the frame member by continuing from the upper side of the inner wall, the path of infiltration of water and the like from outside into the oscillation space is lengthened by the existence of the descending part, thereby enabling maintenance of the normal condition of airtightness of the oscillation space over a long period of time.

EMBODIMENTS

Figure 1:
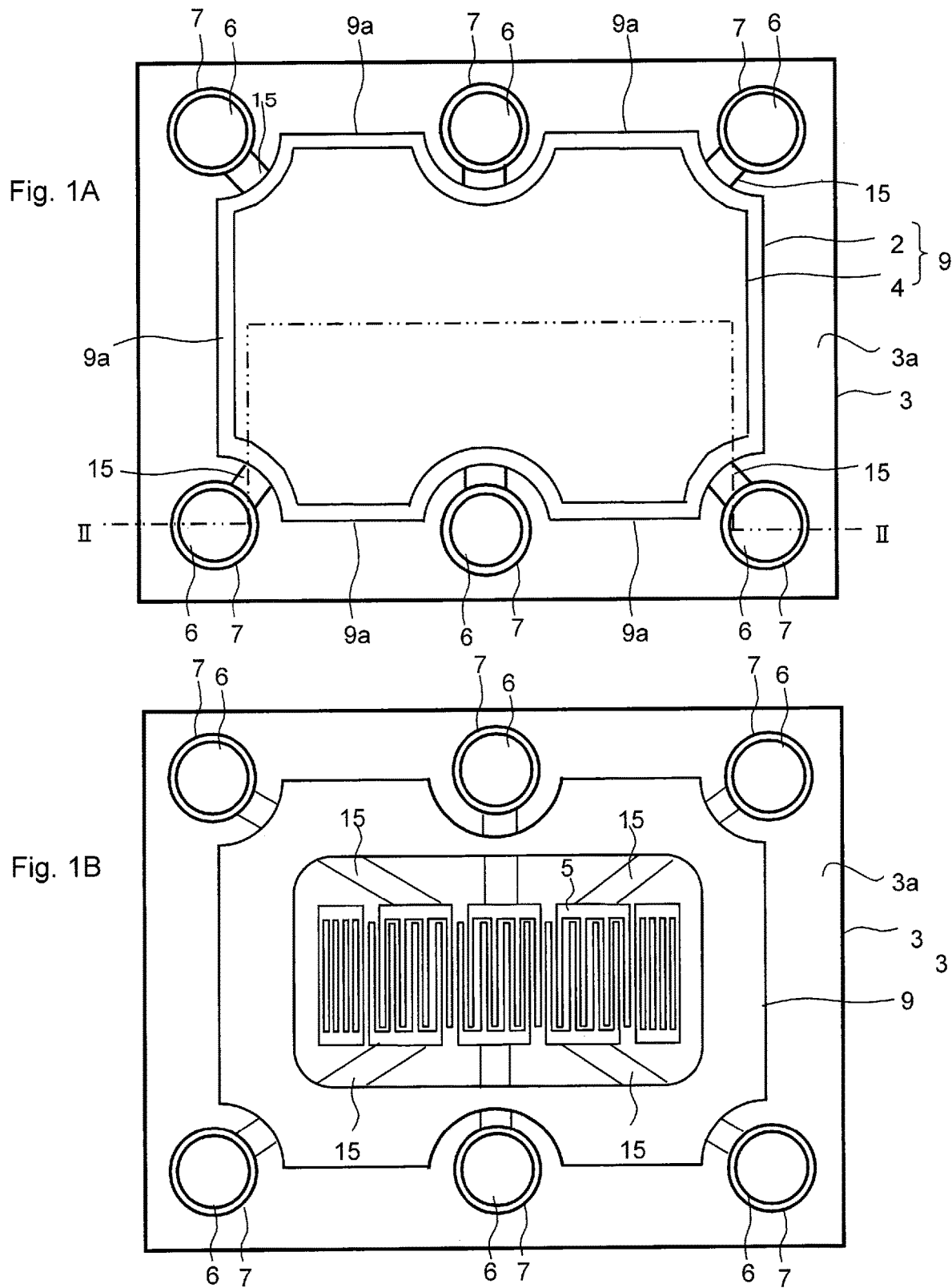
FIG. 1A is a plan view of a SAW device according to a first embodiment of the present invention.
FIG. 1B is a plan view of the SAW device of FIG. 1A with the lid member thereof removed.

SAW devices that embody the present invention are described below, with references made to the drawings. The drawings used in the following descriptions are schematic in nature, and the dimensional proportions noted in the drawings are not necessarily the same as in reality.

In the second and subsequent embodiments, elements that are common to or similar to those in already-described embodiments are assigned the same reference numerals as in the previous embodiments and drawings and descriptions thereof are omitted.

<First Embodiment>

(Constitution of an SAW Device or the Like)

Figure 2:
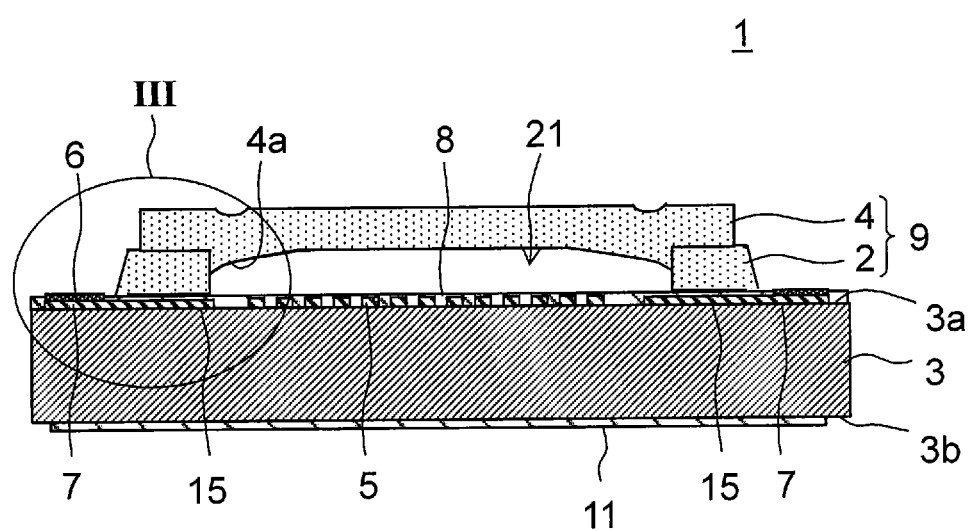
FIG. 2 is a cross-sectional view along line II-II in FIG. 1A.

FIG. 1 (a) is a plan view of an SAW device 1 according to the first embodiment of the present invention, and FIG. 1 (b) is a plan view of the SAW device of FIG. 1 (a) with the lid member 4 thereof removed. FIG. 2 is a cross-sectional view along line II-II in FIG. 1 (a).

The SAW device 1 has an element substrate 3, an excitation electrodes 5 provided on a first main surface 3a of the element substrate 3, pads 7 provided on the first main surface 3a and connected to the excitation electrodes 5, a cover 9 covering the excitation electrode 5 and exposing the pads 7, and a rear surface part 11 provided on a second main surface 3b of the element substrate 3.

The SAW device 1 has a signal input thereto, via one of the plurality of pads 7. The excitation electrode 5 or the like filter the input signal, and the SAW device 1 outputs the filtered signal via one of the plurality of pads 7. The specific constitutions of the various elements are described below.

The element substrate 3 is constituted by a piezoelectric substrate. Specifically, for example, the element substrate 3 is constituted by a signal crystal substrate such as a lithium tantalate single crystal or a lithium niobate single crystal having piezoelectric properties. The element substrate 3 is, for example, a cuboid having a first main surface 3a and a second main surface 3b that are both mutually parallel and planar rectangles. The size of the element substrate 3 may be established as appropriate and, for example, the thickness (in the Z direction) is 0.2 mm to 0.5 mm, and the length (in the X direction or Y direction) of one side is 0.5 mm to 3 mm.

The excitation electrodes 5 are formed on the first main surface 3a. The excitation electrodes 5 form a so-called IDT (interdigital transducer), having a pair of comb-shaped electrodes. Each comb-shaped electrode has a bus bar extending in the direction of propagation of an acoustic surface wave in the element substrate 3 and a plurality of electrode fingers extending from the bus bar in a direction perpendicular to the direction of propagation thereof. The electrode fingers of one of the two comb-shaped electrodes alternatively interleave with those of the other comb-shaped electrode.

Because FIG. 1 and the like are schematic representations, they show a pair of comb-shaped electrodes with several electrode fingers, although in reality a plurality of pairs of comb-shaped electrodes with more electrode fingers may be provided. Additionally, a ladder-type SAW filter may be configured with a plurality of excitation electrodes 5 connected in series or parallel or the like, or a double-mode SAW resonator filter may be configured in which a plurality of excitation electrodes 5 are disposed in the direction of propagation of acoustic surface waves.

The pads 7 are formed on the first main surface 3a. The plan-view shapes of the pads 7 may be established as appropriate and are, for example, circular. The number and positions of disposition of pads 7 are appropriately established in accordance with the configuration of the filter constituted by the excitation electrodes 5. In the SAW device 1, the example shown is one in which six pads 7 are disposed along the outer periphery of the first main surface 3a.

The excitation electrodes 5 and the pads 7 are connected by interconnects 15. The interconnects 15 are formed on the first main surface 3a and connect the bus bars of the excitation electrodes 5 to the pads 7. The interconnects 15 may be formed not only so as to have parts formed on the first main surface 3a, but also so that two interconnects 15 in which different signals flow intersect by one crossing over the other, with an intervening insulator.

The excitation electrodes 5, the pads 7, and the interconnects 15 are constituted, for example, by the same electrically conductive material. The electrically conductive material is, for example, Al or an Al alloy such as an Al—Cu alloy. The excitation electrodes 5, the pads 7, and the interconnects 15 are formed, for example, to have the same mutual thickness, the thickness thereof being, for example, 100 to 500 nm. When interconnects 15 cross over one another, the interconnect 15 on the first main surface 3a side is formed, for example, from an Al—Cu alloy, and the interconnect 15 disposed there over with an intervening insulator is formed, for example, by a multilayer-structure interconnect of the sequence Cr/Ni/Au or Cr/Al from the bottom. If the upper interconnect of crossover interconnects is formed from Cr/Ni/Au, because the intimacy of contact between the uppermost Au layer and the resin is relatively weak, the cover 9, which is made of resin, is best not stacked over the crossover intersection. This suppresses peeling of the cover 9. In contrast, if the upper interconnect of crossover interconnects is formed by Cr/Al, the cover 9 may be stacked over the crossover interconnects.

For the purpose, for example, of improving the connectivity with an electrically conductive bonding material, connection-enhancement layers 6 are provided on the pads 7, in addition to a layer of the same material and thickness as the excitation electrodes 5. The connection-enhancement layers 6 are formed, for example, by nickel layers overlaying the pads 7 and gold layers overlaying the nickel layers.

The cover 9 has, for example, protruding parts 9a that protrude between neighboring pads 7, and has a substantially rectangular plan-view shape, with the exception of the protruding parts 9a. Stated differently, the cover 9 can be seen to be a rectangle of a size covering the pads 7, in which cutouts are formed so as to expose the pads 7.

The cover 9 is provided over the first main surface 3a and has, when viewed in plan view, a frame member 2 that surrounds the excitation electrodes 5, and a lid member 4 blocking the aperture of the frame member 2. The space surrounded by the first main surface 3a, the frame member 2, and the lid member 4 forms an oscillation space 21 so as not to hinder SAW oscillation excited by the excitation electrodes 5.

The plan-view shape of the oscillation space 21 may be established as appropriate, and in the SAW device 1 is generally rectangular. The cover 9 may take a shape having a recess at the bottom side thereof, forming a part of the oscillation space 21.

The frame member 2 is constituted by forming one or more apertures that form the oscillation space 21 in a layer having a substantially uniform thickness. The thickness of the frame member 2 (height of the oscillation space 21) is, for example, several µm to 30 µm. The lid member 4 is formed by a layer having a substantially uniform thickness. The thickness of the lid member 4 is, for example, several µm to 30 µm.

The plan-view shape of the lid member 4 is, for example, substantially the same as the plan-view shape of the frame member 2, and the lid member 4 is formed to be somewhat smaller than the frame member 2. Stated differently, the frame member 2 is formed to have a size so that, when seen in plan view, the outer periphery thereof extends outward a bit from the lid member 4.

The frame member 2 and the lid member 4 may be formed of the same material or mutually different materials. Although in the present application, as a convenience in description, the part between the frame member 2 and the lid member 4 is shown as a border line, the frame member 2 and the lid member 4 in an actual product may be formed as one, of the same material.

The cover 9 (frame 2 and lid member 4) is formed of a photosensitive resin. The photosensitive resin is, for example, urethane acrylate-based, polyester acrylate-based, or an epoxy acrylate-based resin that cures by radical polymerization of acryl or metaacryl radicals. Alternatively, a polyimide-based resin or the like may be used.

The rear surface part 11 has, for example, a rear-surface electrode that covers substantially the entire surface of the second main surface 3b of the element substrate 3, and an insulating protective layer covering the rear-surface electrode. The rear-surface electrode discharges an electrical charge that is charged on the surface of the element substrate 3 by a change in temperature or the like. The protective layer suppresses damage to the element substrate 3. In the following, illustration and description of the rear-surface part 11 will sometimes be omitted.

Figure 3:
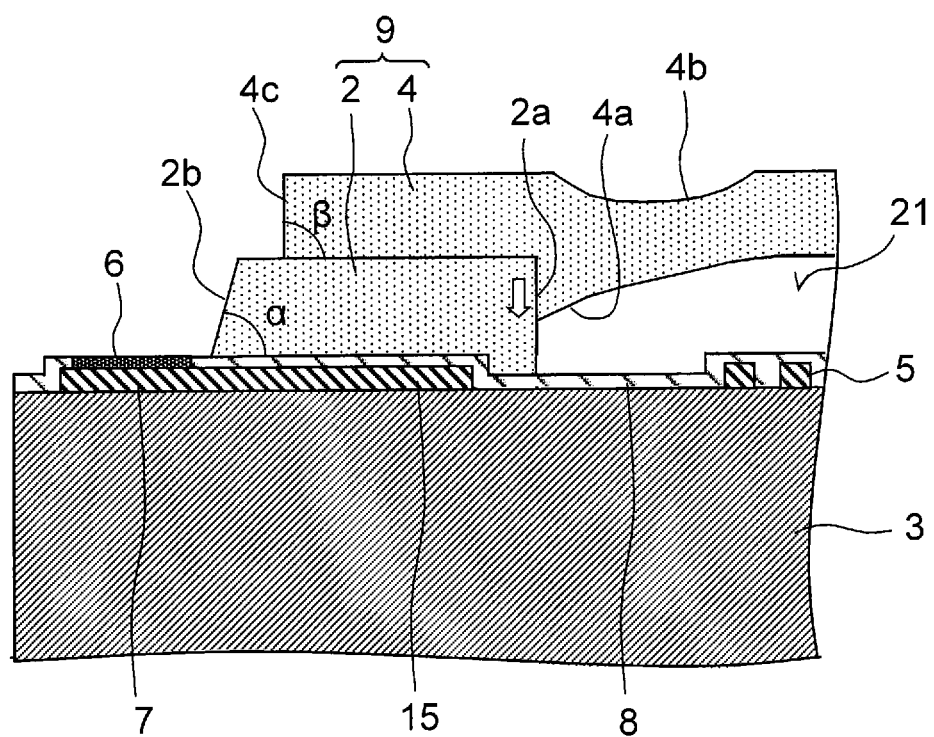
FIG. 3 is an enlarged view of the region indicated by III in FIG. 2.

FIG. 3 is an enlarged view of region III in FIG. 2.

A protective layer 8 is disposed on the first main surface 3a of the element substrate 3, and the cover 9 is disposed over the protective layer 8. The protective layer 8 covers the excitation electrodes 5 and contributes to, for example, the prevention of oxidation of the excitation electrodes 5. The protective layer 8 is formed of, for example, silicon oxide ($SiO_2$ or the like), aluminum oxide, zinc oxide, titanium oxide, silicon nitride, or silicon. The thickness of the protective layer 8 is, for example, approximately 1/10 of the thickness of the excitation electrodes 5 (i.e., 10 to 30 nm), or is 200 to 1500 nm, which is thicker than the excitation electrodes 5.

The pads 7 or the connection-enhancement layers 6 are exposed from the protective layer 8. Although in FIG. 3 apertures in the protective layer 8 for exposing the connection-enhancement layers 6 have the same shape and surface area as the connection-enhancement layers 6, these apertures may be formed larger or smaller than the connection-enhancement layers 6 (even if the peripheral parts of the protective layer 8 apertures cover the outer peripheral parts of the connection-enhancement layers 6).

As shown in the same drawing, in the SAW device 1, the lid member 4 has a descending part 4a. The descending part 4a is the part of the lid member 4 that covers at least a part of the inner wall 2a along from the upper edge of the inner wall 2a of the frame member 2. In the SAW device 1, the descending part 4a covers substantially the upper half of the inner wall 2a of the frame member 2. Providing the lid member 4 with a descending part 4a such as this increases the contact surface area between the lid member 4 and the frame member 2, thereby suppressing peeling between the lid member 4 and the frame member 2. In addition, when water from the outside intrudes from the boundary part between the lid member 4 and the frame member 2, because the length of the path of intrusion is increased to the extent of the contact of the descending part 4a with the inner wall of the frame member 2, as shown by the white arrow, it is difficult for water to enter the oscillation space 21. It is therefore possible to suppress corrosion of the excitation electrodes 5 and the like inside the oscillation space, making it possible to stabilize the electrical characteristics of the SAW device 1 over a long period of time.

The descending part 4a is formed, for example, to appear to have an annular shape when seen in plan view. That is, it circles around and covers the inner wall 2a of the frame member 2. This further increases the effect of suppressing the intrusion of water from between the lid member 4 and the frame member 2.

The descending part 4a can be formed, for example, by adjusting the temperature conditions or the like when attaching the lid member 4 to the frame member 2. For example, although heating might be done to a temperature high enough to attach a lid member 4 made of resin to a frame member 2 made of resin, making the temperature at that time a bit higher than the usual temperature and adjusting the time for holding the temperature at that temperature to be a bit longer than usual causes a part of the lid member 4 made of resin to descend along the inner wall 2a of the frame member 2 and harden, thereby forming the descending part 4a. Accompanying the formation of the descending part 4a, a minute depression 4b might be formed in the region of the upper surface of the lid member 4 immediately above the descending part 4a.

The outer wall 2b of the frame member 2 is inclined so that it spreads progressively outward toward the first main surface 3a of the element substrate 3. The angle α of the outer wall 2b of the frame member 2 with respect to the first main surface 3a is, for example, approximately 80°. The lower edge of the outer wall 2b is at a distance from the connection-enhancement layer 6 (or the pad 7 when there is no connection-enhancement layer 6). That distance is, for example, from 40 μm to 65 μm.

The outer wall 4c of the lid member 4 may be inclined so as to spread progressively outward moving toward the first main surface 3a of the element substrate 3, in the same manner as the outer wall 2b of the frame member 2, or alternatively may not be inclined. The angle β of the outer wall 4b of the lid member 4 with respect to the main surface 3a may be, for example, the same as the angle α, larger than α, or smaller than α. The side wall 4c of the lid member 4 is positioned slightly inside the outer wall 2b of the frame member 2. Stated differently, when seen in plan view, the lid member 4 is somewhat smaller than the frame member 2. For example, the inner wall 4c of the lid member 4 is positioned from several μm to several tens of μm toward the inside of the outer wall 2b of the frame member 2.

Figure 4:
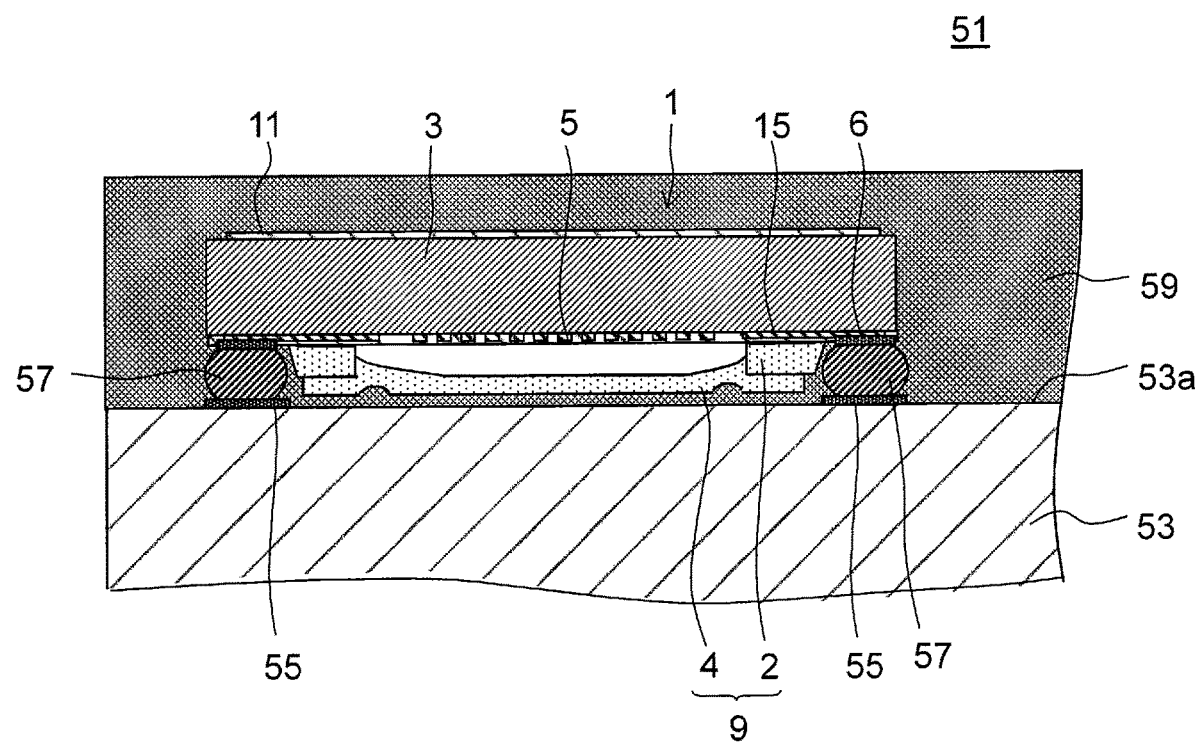
FIG. 4 is a cross-sectional view of an electronic component according to an embodiment of the present invention.
Figure 5A:
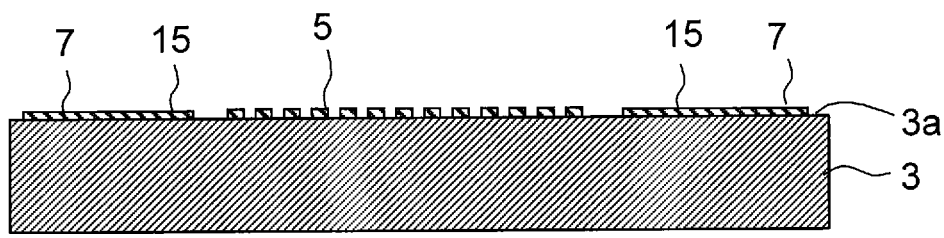
FIG. 5A to FIG. 5D are cross-sectional views describing a method of manufacturing the electronic component of FIG. 4.
Figure 5B:
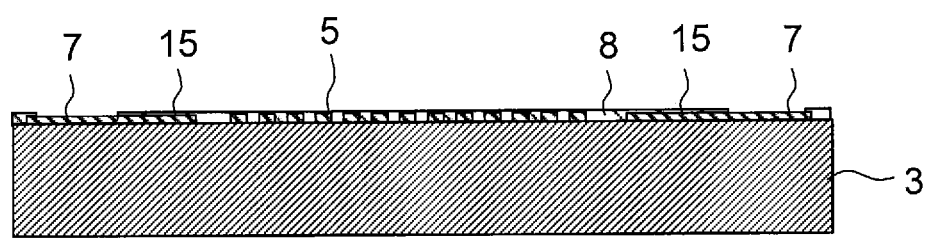
Figure 5C:
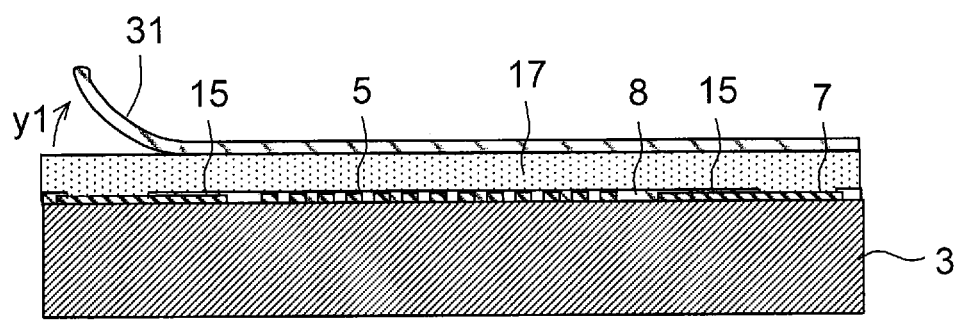
Figure 5D:
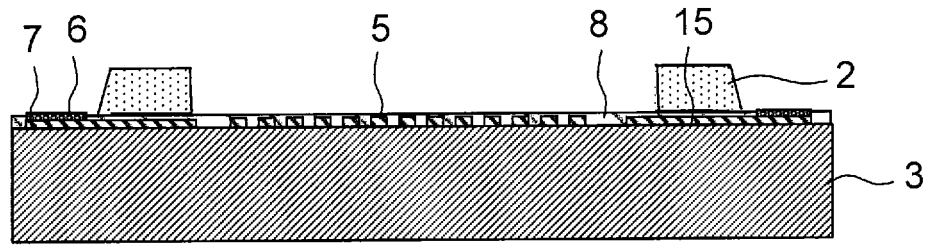

FIG. 4 is a cross-sectional view showing a part of an electronic component 51 on which the SAW device 1 is mounted.

The electronic component 51 has a mounting substrate 53, pads 55 provided on a mounting surface 53a of the mounting substrate 53, an electrically conductive bonding material 57 disposed over the pads 55, the SAW device 1 mounted to the mounting surface 53a with the electrically conductive bonding material 57 interposed there between, and a molding resin 59 that seals the SAW device 1.

The electronic component 51, for example, alternatively also has an IC or the like mounted on the mounting substrate 53, which, together with the SAW device 1, is sealed by the molding resin 59, thereby constituting a module.

The mounting substrate 53 is constituted by, for example, a printed circuit board. The printed circuit board may be a rigid board or a flexible board. The printed circuit board may be a single-layer board, a two-layer board, or a board with more than two layers. The base material, the insulating material, and the electrically conductive material of the printed circuit board may be selected as appropriate materials.

The electrically conductive bonding material 57 is in contact with the pads 7 of the SAW device 1 and the pads 55 of the mounting substrate 53. The electrically conductive bonding material 57 is formed from a metal that melts with heating to become attached to the pads 7. The electrically conductive bonding material 57 is made of, for example, solder. The solder may be a solder such as a Pb—Sn alloy that uses lead, or a lead-free solder such as an Au—Sn alloy, an Au—Ge alloy, an Sn—Ag alloy, or an Sn—Cu alloy.

The molding resin 59 has as main components, for example, an epoxy resin, a curing agent, and a filler. The molding resin 59 not only covers the SAW device 1 from the rear surface part 11 side and from the side, but is also filled between the SAW device 1 and the mounting substrate 53. Specifically, the molding resin 59 is filled between the upper surface of the cover 9 and the mounting surface 53a of the mounting substrate 53, and also in the periphery of the electrically conductive bonding material 57.

The electrically conductive bonding material 57 is formed, for example, by substantially spherically shaped conductive bumps or the like that are then crushed by the pads 7 and the pads 55. That is, the electrically conductive bonding material 57 has two planar surfaces making contact with the pads 7 and the pads 55, and an outer peripheral surface connecting the two planar surfaces, the two planar surfaces and the outer peripheral surface being circular when seen in plan view, and the center part of the outer peripheral surface being a curved surface bulging outward when viewed from the side.

The surface area of the planar surfaces of the electrically conductive bonding material 57 in contact with the pads 7 and the pads 55 is preferably the same as or smaller than the surface area of the pads 7 and the pads 55.

The side wall 2b of the frame member 2 and the side wall 4b of the lid member 4 do not make contact with the electrically conductive bonding material 57 over their entirety. Therefore, the gap between the outer wall of the cover 9 (frame member 2 and lid member 4) and the electrically conductive bonding material 57 is formed from the upper surface of the cover 9 down to the lower surface thereof, and the molding resin 59 is filled into that gap.

Because, in this manner, the side wall 2b of the frame member 2 and the side wall 4b of the lid member 4 do not make contact with the electrically conductive bonding material 57 over their entirety and the molding resin fills between these side walls and the electrically conductive bonding material 57, the electrically conductive bonding material 57 is not easily influenced by the shape of the outer wall of the cover 9. As a result, for example, it is possible to avoid the formation of a shape at which a stress concentration tends to occur in the electrically conductive bonding material 57 due to a corner part or the like between the outer wall and the upper surface of the cover 9, thereby preventing cracking of the electrically conductive bonding material 57. These effects are particularly prominent when the molding resin 59 fills between the electrically conductive bonding material 57 and the outer wall of the cover 9 along from the upper surface to the lower surface of the cover 9.

Also, as noted above, the outer wall 2b of the frame member 2 constituting the cover 9 is inclined so that it broadens progressively toward the main surface 3a of the element substrate 3, and the molding resin 59 is in contact with that inclined outer wall 2b.

Therefore, for example, between the inclined outer wall 2b and the electrically conductive bonding material 57, the molding resin 59 flows easily from the upper surface side to the lower surface side of the cover 9, thereby avoiding the formation of a void in the molding resin 59. If a void occurs in the molding resin 59, the void will expand when heat is applied during reflow soldering, this causing a mounting failure of the SAW device 1, but avoiding the formation of a void prevents the occurrence of such mounting failures.

Because the outer wall 4c of the lid member 4 is positioned further inside than the outer wall 2b of the frame member 2, the same type of effect as noted above attributed to the inclination of the outer wall 2b of the frame member 2 can be expected. That is, between the outer wall of the cover 9 and the electrically conductive bonding material 57, the molding resin 59 flows easily from the upper surface side to the lower surface side of the cover 9.

(Method for Manufacturing the SAW Device)

Figure 6A:
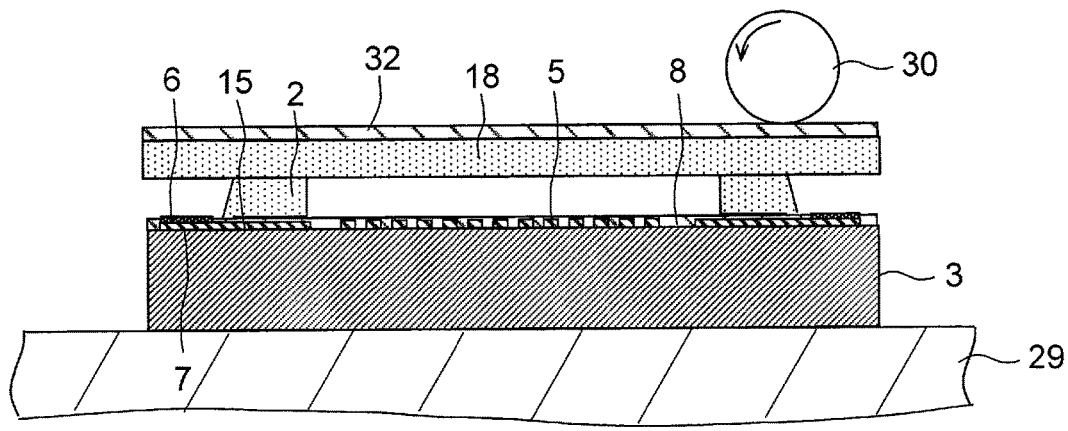
FIG. 6A to FIG. 6C are cross-sectional views showing the continuation from FIG. 5D.
Figure 6B:
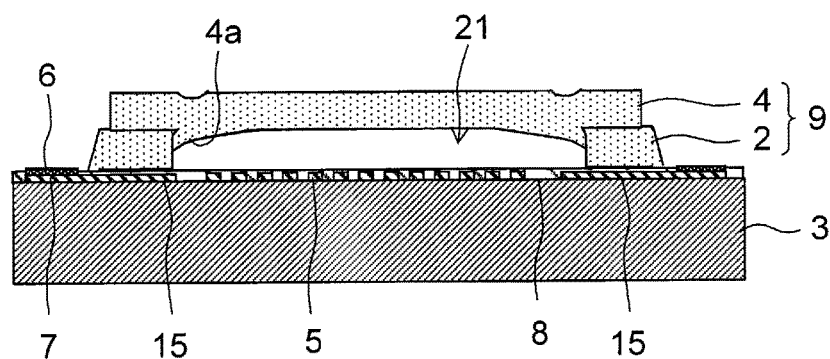
Figure 6C:
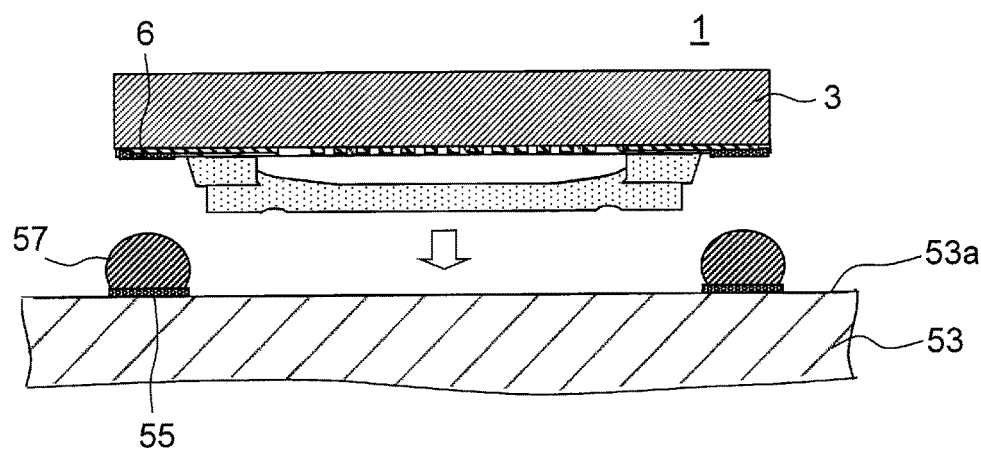

FIG. 5 (a) to FIG. 6 (c) are cross-sectional views (corresponding to line in FIG. 1) describing the method for manufacturing the SAW device 1 and the electronic component 51. The manufacturing process steps proceed in sequence from FIG. 5 (a) to FIG. 6 (c).

The process steps of FIG. 5 (a) to FIG. 6 (c) corresponding to the method for manufacturing the SAW device 1 are performed in a so-called wafer process. That is, thin-film formation and photolithography and the like are performed on the mother substrate that will, by dividing, become the element substrates 3, after which dicing is done to form a large number of SAW devices 1 in parallel. In FIG. 5 (a) to FIG. 6 (c), however, only the part corresponding to one SAW device 1 is shown. Additionally, although the electrically conductive layers and insulating layers change configuration as the processing proceeds, there are cases in which reference numerals are used in common before and after such changes.

As showed in FIG. 5 (a), first the excitation electrodes 5, pads 7, and interconnects 15 are formed on the main surface 3a of the element substrate 3. Specifically, by forming a thin film using a method such as sputtering, vapor deposition, or CVD (chemical vapor deposition), a metal layer is formed on the main surface 3a. The metal layer is then patterned by photolithography or the like, using a reduction projection type exposure system (stepper) and RIE (reactive ion etching). The patterning forms the excitation electrodes 5, the interconnects 15, and the pads 7.

When the excitation electrodes 5 and the like are formed, as shown in FIG. 5 (b), the protective layer 8 is formed. Specifically, an appropriate method for forming a thin film is used to form the protective layer 8. The thin film forming method is, for example, sputtering or CVD. Next, a part of the thin film is removed, using RIE or the like, so as to expose the pads 7. This forms the protective layer 8.

When the protective layer 8 is formed, as shown in FIG. 5 (c), a thin film made of photosensitive resin is formed that serves as the frame member 2. The thin film is formed, for example, by the affixing of a film. The film has, for example, a base film 31 and a resin layer 17 affixed to the base film 31 that will become the frame member 2. After causing the resin layer 17 to come into intimate contact with the protective layer 8, the base film 31 is peeled away as shown by the arrow y1. The thin film that becomes the frame member 2 may be formed by the same thin-film forming method as is the protective layer 8, or may alternatively be formed by the spin-coating method or the like.

When the thin film that becomes the frame member 2 is formed, as shown in FIG. 5 (d), photolithography or the like is used to remove the thin film in the region along the outer periphery of the element substrate 3 on which are disposed the thin film and the pads 7 over the excitation electrodes 5. The thin film is removed to a uniform width above the dicing lines as well. If the thin film that becomes the frame member 2 is formed by the affixing of a film, the process step of peeling the base film 31 may be performed after the exposure process step in the photolithography.

When the frame member 2 is formed, as shown in FIG. 6 (a), a thin film made of a photosensitive resin that will serve as the lid member 4 is formed. The thin film is formed, for example, by the affixing of a film. The film has, for example, a base film 32 and a resin layer 18 affixed to the base film 32 will become the lid member 4. The resin layer 18 and the frame member 2 are adhered together by heating the resin layer 18 with the base film 32 affixed thereto. The adhesion of the resin layer 18 and the frame member 2 is done, for example, by placing the element substrate 3 onto a stage 29 heated to a temperature from 40° C. to approximately 50° C. and, in this condition, pressing a roller 30 that has also been heated to a temperature from 40° C. to approximately 50° C. against the resin layer 18 while rolling the roller 30. When this is done, by setting the conditions of the temperature of the stage 29 and the roller 30 and the rotational speed of the roller, it is possible to have the softened resin layer 18 droop along the inner wall 2a of the frame member 2, this drooping part becoming the descending part 4a. The shape of the descending part 4a can be controlled to some extent by the adjusting the temperature of the stage 29 and the roller 30, the time of holding on the stage 29, and the rotational speed of the roller and the like. For example, if an epoxy acrylate is used as the material of the frame member 2 and the resin layer 18 and the thickness of the frame member 2 and the resin layer 18 is made 30 μm, by making the temperature of the stage 29 and the roller 30 be approximately 42° C. to 45° C., which is several degrees higher than the usual adhesion temperature, it is possible to form the descending part 4a so as to cover approximately the upper half of the inner wall 2a of the frame member 2.

After the above, by peeling away the base film 32 and using photolithography or the like to remove the region along the outer periphery of the resin layer 18 that will become the lid member 4, a lid member 4 having the descending part 4a such as shown in FIG. 6 (b) is formed. The thin film is removed to a uniform width above the dicing lines as well. The forming of the lid member 4 forms the oscillation space 21, which is a space surrounded by the protective layer 8, the frame member 2, and the lid member 4. The method of forming the oscillation space 21 is not restricted to this method. For example, a sacrificial layer may be formed beforehand in a part in which the oscillation space 21 is to be formed, and resin that will become the cover may be formed so as to cover the sacrificial layer, after which the sacrificial layer is removed to form the oscillation space.

When the lid member 4 is formed, the SAW device 1 is cut out of the wafer and mounted to the mounting substrate 53, as shown in FIG. 6 (c). Before the SAW device 1 is mounted, the pads 55 and the electrically conductive bonding materials 57 are provided on the mounting surface 53a of the mounting substrate 53. If the electrically conductive bonding materials 57 are conductive bumps before bonding the SAW device 1, they are formed so as to be substantially spherical or hemispherical by utilizing the effect of surface tension or the like, using, for example, vapor deposition, plating, or printing.

The upper surface of the cover 9 of the SAW device 1 is then disposed so that it is in opposition with the mounting surface 53a. The electrically conductive bonding materials 57 are brought into contact with the pads 7 on the SAW device 1 side so as to support the SAW device 1. After that, the SAW device 1 and the mounting substrate 53, by being passed through a reflow oven or the like are temporarily heated, so that melting and coagulation of the electrically conductive bonding materials 57 fixes together the electrically conductive bonding materials 57 and the pads 7.

After the above, the SAW device 1 is covered by the molding resin 59. The molding resin 59 is supplied to the area surrounding the SAW device 1, for example, by the transfer molding method or by printing. The molding resin 59 supplied to the area surrounding the SAW device 1 flows between the upper surface of the cover 9 and the mounting surface 53a by the pressure applied thereto, and also flows between side surface of the cover 9 and the electrically conductive bonding materials 57. The above completes the fabrication of the electronic component 51 shown in FIG. 4.

(Variation Example)

Figure 7:
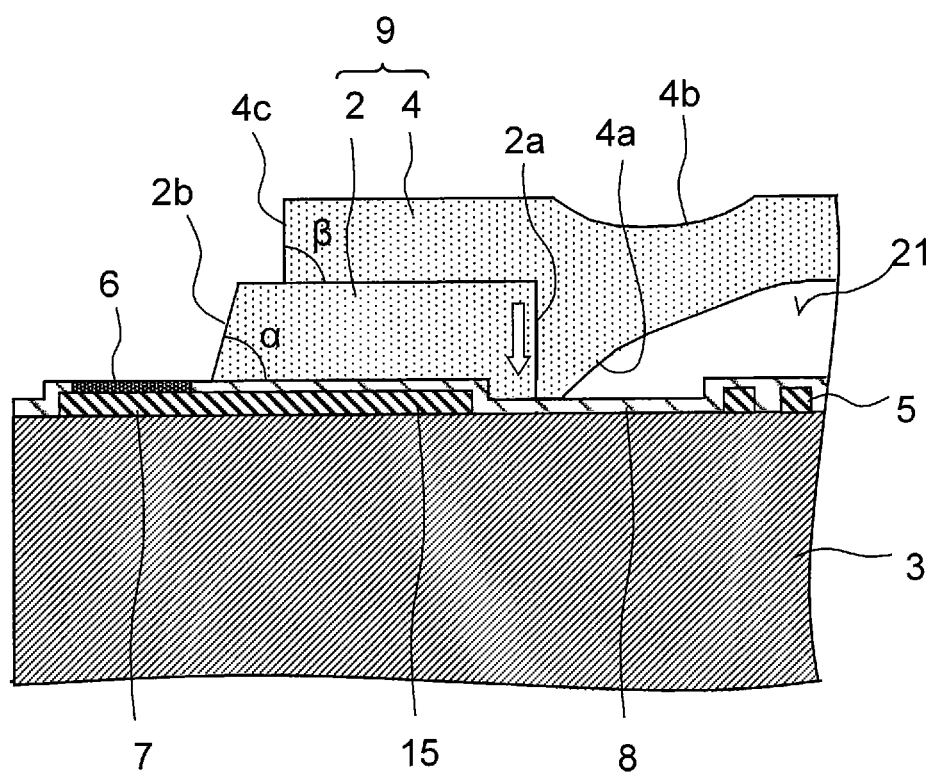
FIG. 7 is an enlarged cross-sectional view showing a variation example of the SAW device shown in FIG. 1.

FIG. 7 is an enlarged cross-sectional view showing a variation example of the SAW device 1 according to the first embodiment. The cross-sectional view of FIG. 7 corresponds to the part shown in FIG. 4.

The SAW device 1 in the subject variation example differs from the SAW device 1 shown in FIG. 1 with respect to the shape of the descending part 4a. Specifically, in the SAW device 1 of the variation example, the lower end of the descending part 4a reaches down to the first main surface 3a of the element substrate 3. By the lower end of the descending part 4a reaching down to the main surface 3a in this manner, the contact surface area between the descending part 4a and the inner wall 2a of the frame member 2 increases, so that not only it is possible to improve the adhesion strength between the lid member 4 and the frame member 2, but also the path of intrusion of water between the lid member 4 and the frame member 2 lengthens, so that it is difficult for water to enter the oscillation space 21. Additionally, even when peeling of the frame member 2 from the element substrate 3 occurs, the path of intrusion of water from the lower edge of the outer wall 2b of the frame member 2 up to the oscillation space 21 is lengthened by the amount of contact of the lower edge of the descending part 4a with the element substrate 3. The result is that this also suppresses intrusion of water into the oscillation space 21, thereby enabling suppression of corrosion of the excitation electrodes 5 and the like.

Figure 23A:
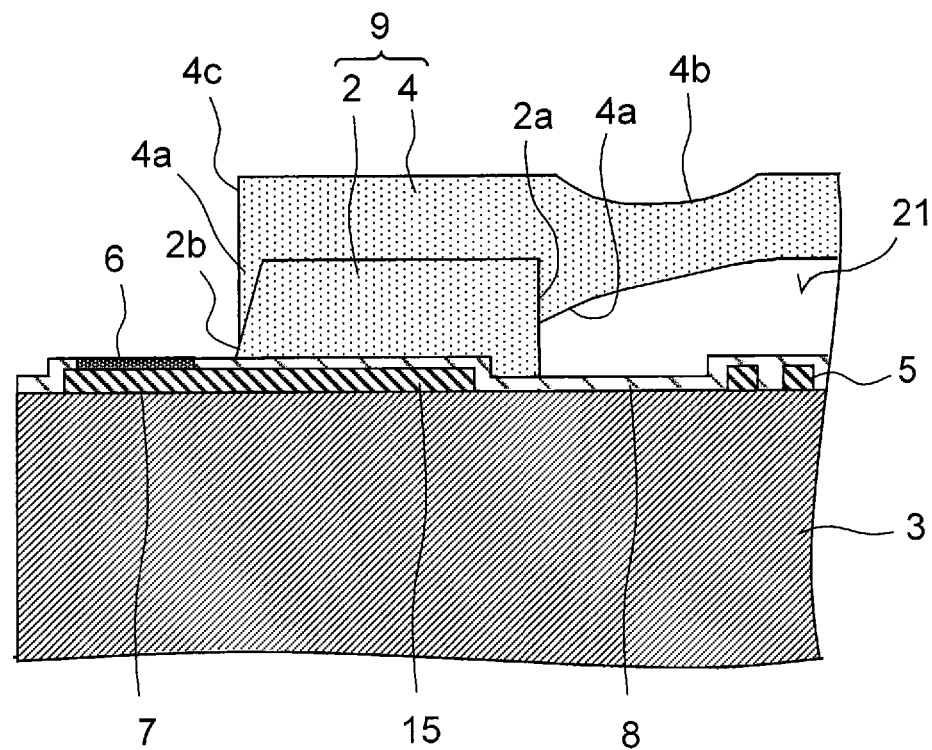
FIG. 23A and FIG. 23B are enlarged cross-sectional views showing other variation examples of the SAW device shown in FIG. 1.
Figure 23B:
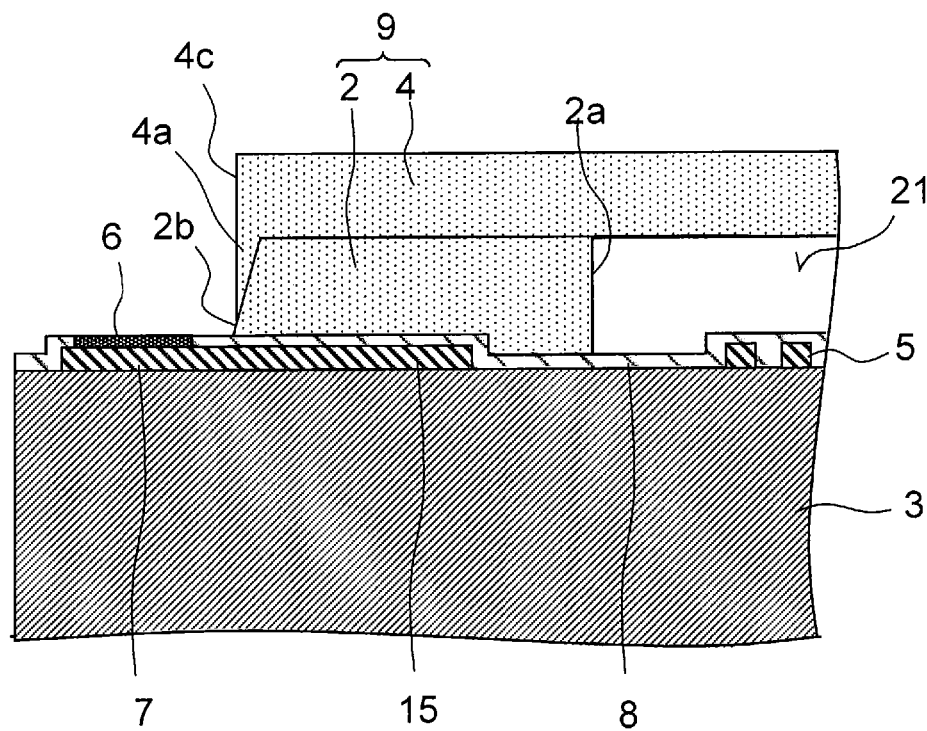

FIG. 23 is an enlarged cross-sectional view showing another variation example of the SAW device 1 in the first embodiment, this being an enlarged cross-sectional view of the location corresponding to the part shown in FIG. 4.

First, in the variation example shown in FIG. 23 (a), the descending part 4a is provided as well on the outer wall side of the frame member 2. That is, the SAW device 1 shown in FIG. 23 (a) has a descending part 4a covering a part of the inner wall 2a along from the upper side of the inner wall 2a of the frame member 2 and descending part 4a covering a part of the outer wall 2b along from the upper side of the outer wall 2b of the frame member 2.

Forming the descending part 4a on not only the inner wall 2a side but also the outer wall 2b side in this manner further increases the contact surface area between the frame member 2 and the lid member 4, enabling improvement of the effect of suppressing peeling between the frame member 2 and the lid member 4. Also, because the length of the part between the frame member 2 and the lid member 4, which can be a path of intrusion of water from the outside, is increased, the effect of suppressing the intrusion of water into the oscillation space 21 is also improved.

In contrast, in the variation example shown in FIG. 23 (b), the descending part 4a is provided on only the outer wall side of the frame member 2, and not provided on the inner wall side of the frame member 2. Even if the descending part 4a is provided on only the outer wall side of the frame member 2, in the same manner as the above-described SAW device 1 in which the descending part 4a is provided on only the inner wall side of the frame member 2, in addition to suppressing peeling between the frame member 2 and the lid member 4, it is possible to suppress intrusion of water into the oscillation space 21. In particular, when the distance between the excitation electrodes 5 and the inner wall 2a of the frame member 2 is small, because the descending part 4a easily comes into contact with the excitation electrodes 5 when the descending part 4a is formed on the inner wall 2a side, by forming the descending part 4a on only the outer wall 2b side of the frame member 2, such as in the SAW device shown in FIG. 23 (b), enables suppression of peeling between the frame member 2 and the lid member 4 and intrusion of water into the oscillation space 21, while preventing contact between the descending part 4a and the excitation electrodes 5.

In which location the descending part 4a is formed can be controlled by adjusting the rotational speed and temperature or the like of the roller 30, for example, so that the rotational speed of the roller 30 shown in FIG. 6 (a) is reduced in the location of forming the descending part 4a.

<Second Embodiment>

Figure 8:
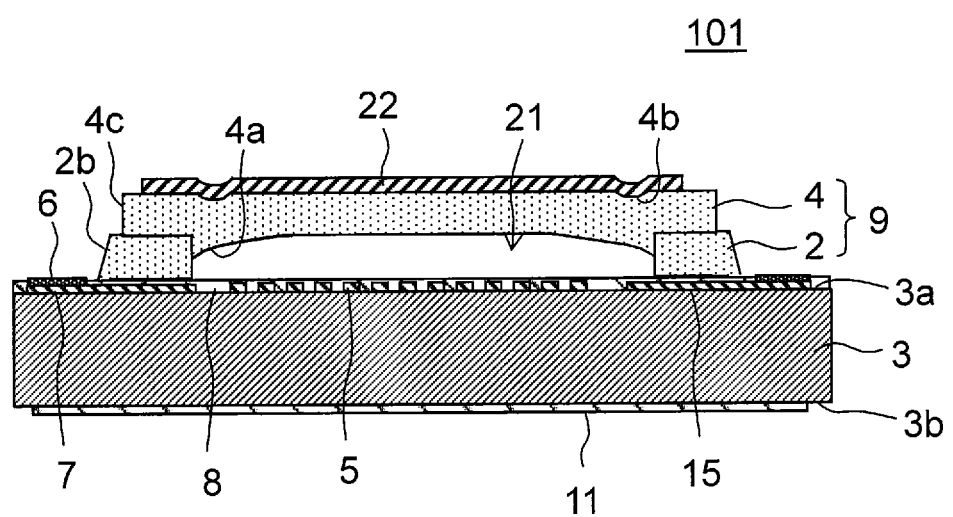
FIG. 8 is a cross-sectional view showing an SAW device according to a second embodiment.

FIG. 8 is a cross-sectional view corresponding to FIG. 2, showing an SAW device 101 of the second embodiment. The SAW device 101 has a reinforcing layer 22 disposed on the upper surface of the cover 9.

The reinforcing layer 22 is for the purpose of reinforcing the strength of the cover 9 (in particular, the lid member 4). The reinforcing layer 22 is formed along a relatively wide range of the cover 9. For example, the reinforcing layer 22 is formed along substantially the entire upper surface of the cover 9. Therefore, the reinforcing layer 22, when seen in plan view, covers substantially the entire oscillation space 21, extending to the outside from the oscillation space 21, and is supported by the lid member 4 and the frame member 2.

Because the SAW device 101 has a descending part 4a, although a minute depression 4b is formed in the region of the upper surface of the cover 9 immediately above the descending part 4a, the reinforcing layer 22 is formed while coming into contact with the inner surface of the minute depression 4b. Thus, by increasing the contact surface area between the reinforcing layer 22 and the upper surface of the cover 9, for example, it is possible to suppress peeling of the reinforcing layer 22 from the cover 9.

The reinforcing layer 22 is constituted by a material having a Young's modulus higher than that of the material of the cover 9. For example, in contrast to the cover 9, which is formed from a resin having a Young's modulus of 0.5 to 1 GPa, the reinforcing layer 22 is formed from a metal having a Young's modulus of 100 to 250 GPa. The thickness of the reinforcing layer 22 is, for example, 1 to 50 μm.

The reinforcing layer 22 has, for example, an underlayer positioned directly on the upper surface of the cover 9, and a metal part overlaid onto the underlayer. The underlayer is formed from, for example, copper, titanium, or a lamination thereof. The thickness of the underlayer is, for example, 300 nm to 1 μm if the underlayer is made of copper, and 10 nm to 100 nm if the underlayer is made of titanium. The metal part is made of, for example, copper.

<Third Embodiment<

Figure 9:
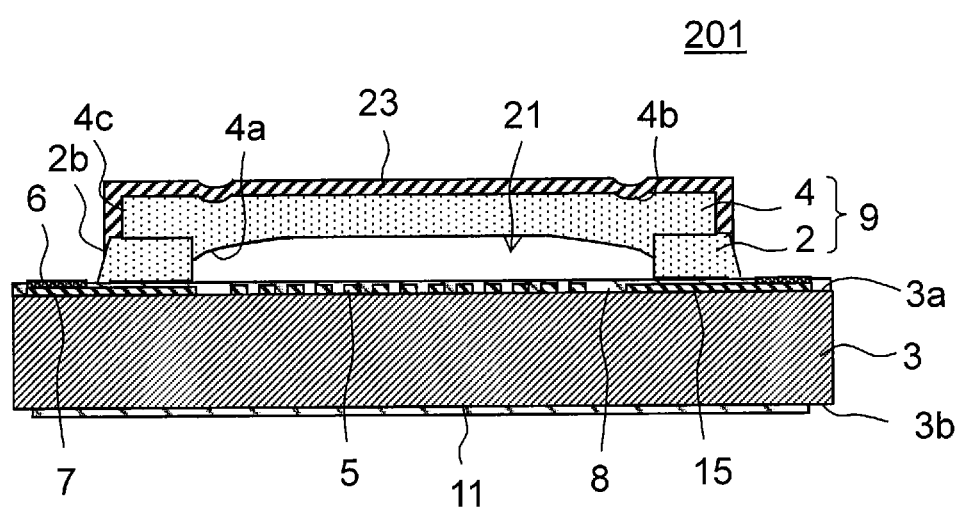
FIG. 9 is a cross-sectional view showing an SAW device according to a third embodiment.

FIG. 9 shows a SAW device 201 of the third embodiment, and is a cross-sectional view corresponding to FIG. 2.

The SAW device 201 has a sealing film 23 covering from the outer wall 2b of the frame member 2 and extending to the side wall 4c of the lid member 4.

Providing the sealing film 23 in this manner that covers from the outer wall 2b of the frame member 2 extending to the side wall 4c of the lid member 4 enables enhancement of the effect of suppressing the intrusion of water and the like, which can intrude between the frame member 2 and the lid member 4, into the oscillation space 21.

An insulating material such as silicon oxide or silicon nitride or a metal material such as copper can be used as the sealing film 23. In the SAW device 201, the sealing film 23 is formed by a metal material and is formed not only from the outer wall 2b of the frame member 2 extending to the side wall 4c of the lid member 4, but also continuously up to the upper surface of the cover 9. This enables use of the sealing film 23 also as the reinforcing layer 22 of the SAW device 101 of the second embodiment.

By positioning the side wall 4c of the lid member 4 further to the inside than the outer wall 2b of the frame member 2, a step is formed between the outer wall 2b of the frame member 2 and the side wall 4c of the lid member 4, thereby facilitating the formation of the sealing film 23 to a sufficient thickness between the outer wall 2b of the frame member 2 and the side wall 4c of the lid member 4.

<Fourth Embodiment>

Figure 10:
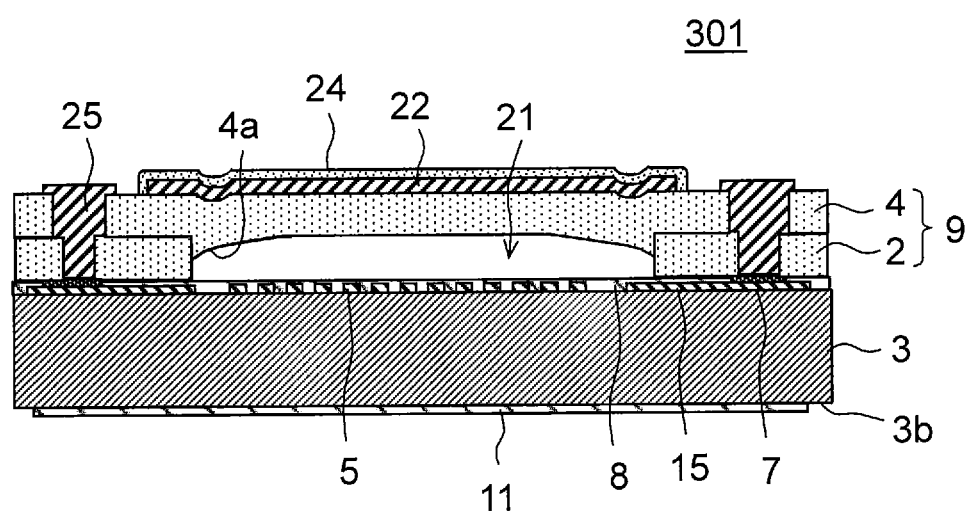
FIG. 10 is a cross-sectional view showing an SAW device according to a fourth embodiment.

FIG. 10 shows a SAW device 301 of the fourth embodiment, this cross-sectional view corresponding to FIG. 2. The SAW device 301 has terminals 25. These terminals 25 are positioned over the pads 7 in the condition of electrical connection with the pads 7. The terminals 25 pass through the cover 9 in the vertical direction and the end parts thereof that are not connected to the pads 7 are exposed from the upper surface of the cover 9. The pads 7 are formed by plating using, for example, copper.

Having provided terminals 25 that pass through the cover 9 in this manner, in the case of providing the reinforcing layer 22 as well, it is preferable that the entire reinforcing layer 22 be covered by an insulating film 24. This enables suppression of shorting between the reinforcing layer 22 and the terminals 25 when the SAW device 301 is mounted to the mounting substrate.

The method for manufacturing the SAW device 301 will be described using FIG. 11 and FIG. 12. Of the process steps for manufacturing the SAW device 301, because the process steps up until the forming of the frame member 2 (process steps shown in FIG. 5 (a) to FIG. 5 (c)) are the same as the processing step for manufacturing the SAW device 1, the descriptions of those parts will be omitted, and the following will be a description of the process steps from the formation of the frame member 2.

Figure 11A:
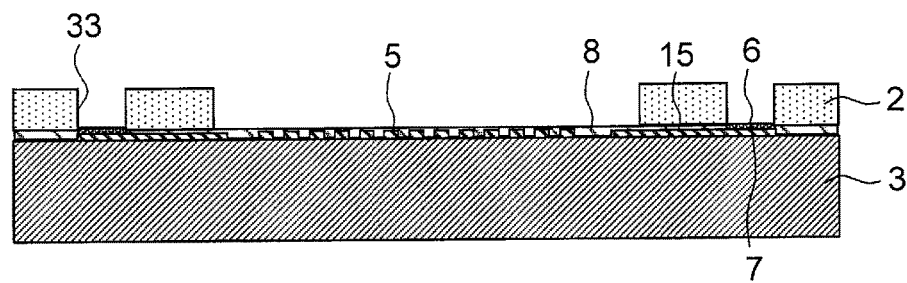
FIG. 11A to FIG. 11C are cross-sectional views describing a method of manufacturing the SAW device according to the fourth embodiment.
Figure 11B:
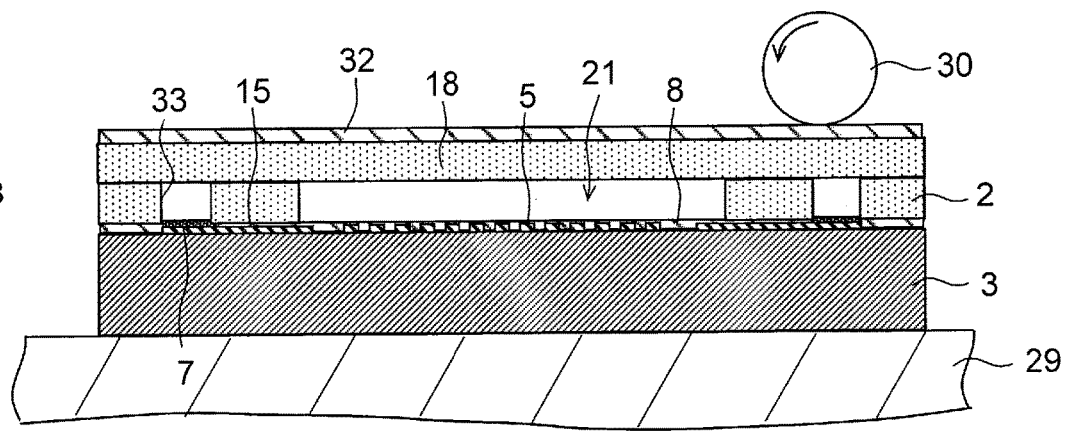

First, as shown in FIG. 11 (a), because it is necessary to form the pillar-shaped terminals 25 in the SAW device 301, the resin layer 17 that will become the frame member 2 is patterned so that first through holes 33 are formed above the pads 7 on which the pillar-shaped terminals 25 are to be formed.

Then, as shown in FIG. 11 (b) a resin layer 18 that will become the cover 4 is adhered to the frame member 2 and the descending part 4a is formed. This process step is basically the same as the process step in the SAW device 1 shown in FIG. 6 (a). In this case, a photosensitive negative-type resist is used as the resin layer 18.

Next, as shown in FIG. 11 (c), the resin layer 18 is exposed through a mask 40. The mask 40 has a transparent substrate 38 and light-blocking parts 39 formed in a prescribed pattern on the lower surface of the transparent substrate 38.

Because the resist layer 18 is a negative type, the parts that are not exposed because of the light-blocking parts 38 are removed by developing after exposure. Thus, the light-blocking parts 38 are disposed at positions at which the resin layer 18 should be removed when the mask 40 is positioned, and have the shape of the parts to be removed. In this embodiment, light-blocking parts 39 disposed at parts immediately above the first through holes 33 and light-blocking parts 39 disposed immediately above regions between the first through holes 33 and the oscillation space 21 are provided.

In this case, the reason for providing light-blocking parts 39 in parts immediately above regions between the first through holes 33 and the oscillation space 21 will be described while comparing with the case in which such light-blocking parts 39 are not provided.

Figure 13A:
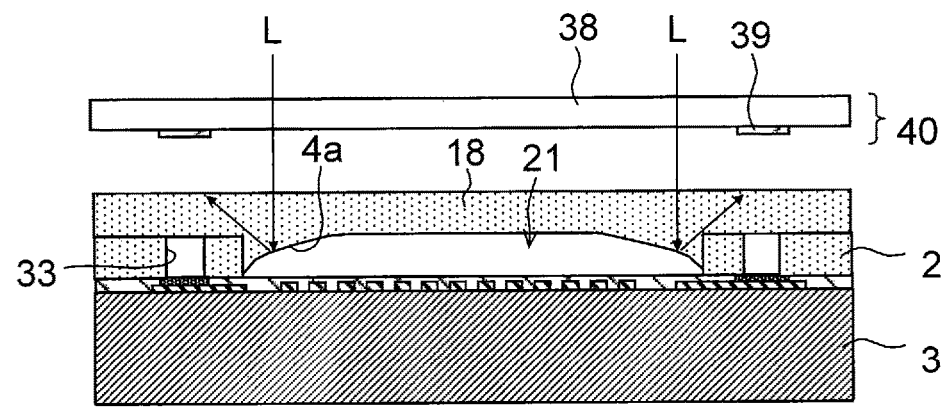
FIG. 13A is a cross-sectional view showing a process step of exposing using a mask in which the light-blocking parts are not provided in parts immediately above the regions between first through holes and an oscillation space.
Figure 13B:
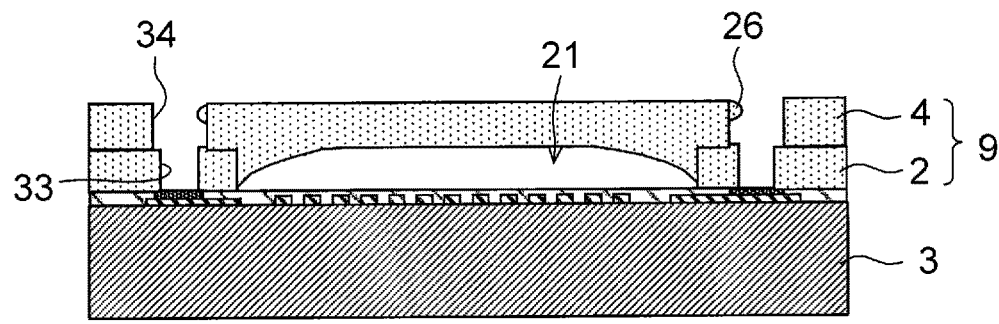
FIG. 13B is a cross-sectional view describing the reason for forming minute protrusions on the inner peripheral surface of the second through hole.

If exposure is done using a mask 40 in which the light-blocking parts 39 immediately above the regions between the first through holes 33 and the oscillation space 21 are not provided, followed by development, as shown in FIG. 13 (b) there are cases in which minute protrusions 26 are formed in the inner peripheral surface of second through holes 34 that are disposed for positioning of the upper side part of the terminals 25.

Although the mechanism for the formation of the minute protrusions 26 such as this is not clear, it is inferred that the following phenomenon in the step of exposing the resin layer 18.

FIG. 13 (a) is a cross-sectional view showing the process step of exposing using a mask 40 in which the light-blocking parts 39 are not provided in parts immediately above the regions between the first through holes 33 and the oscillation space 21. As shown in FIG. 13 (a), a part of the light L used for exposure scatters at the lower edge of the descending part 4a and a part of the scattered light is thought to reach the parts of the resin layer 18 that are parts immediately above the first through holes 33. When this occurs, parts that fundamentally are not supposed to be exposed are exposed, and it is inferred that, when this is subsequently developed, the minute protrusions 26 are formed, as shown in FIG. 13 (b).

When such minute protrusions 26 exists on the inner peripheral surface of the second through holes 34, when forming a plating underlayer on the inner peripheral surface of the second though holes 34 using sputtering or the like, the minute protrusions 26 act as obstacles, so that parts occur in which the plating underlayer is not formed. Because plating does not grow in parts in which the plating underlayer does not exist, the terminals 25 take on irregular shapes, this being a cause of mounting failures and the like.

In contrast, as shown in FIG. 11 (c), when light-blocking parts 39 are provided in parts immediately above regions between the first through holes 33 and the oscillation space 21, even if a part of the light L used for exposure that has scattered at the lower edge of the descending part 4a is directed toward the regions immediately above the first through holes 33, because before it reaches there it exposes parts further to the inside from the regions immediately above the first through holes 33 (the regions T surrounded by dotted lines in FIG. 11 (c)) that should not be exposed, using the photosensitivity of the regions T, so that it is difficult to reach the regions immediately above the first through holes 33. This suppresses exposure of the regions immediately above the first through holes 33 by scattered light, making difficult the formation of the minute protrusions 26.

Figure 11C:
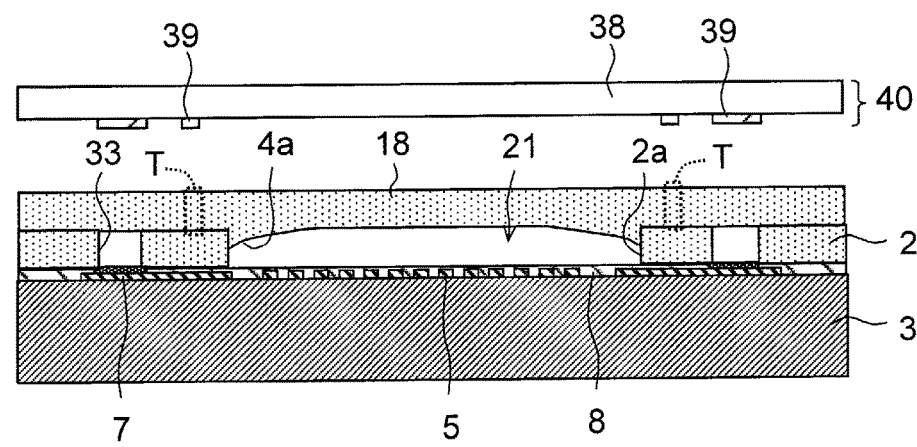
Figure 12A:
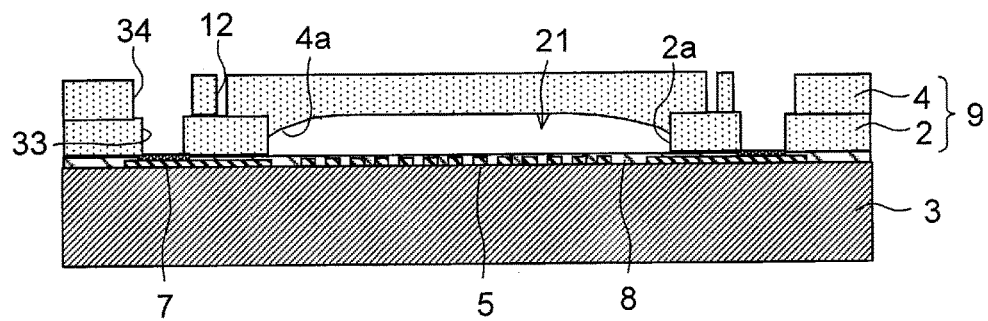
FIG. 12A to FIG. 12C are cross-sectional views describing a method of manufacturing the SAW device according to the fourth embodiment, showing the process steps continuing from FIG. 11C.
Figure 12B:
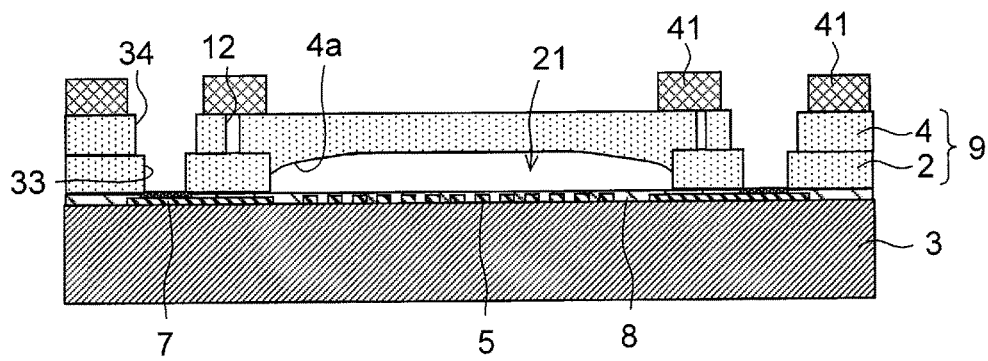
Figure 12C:
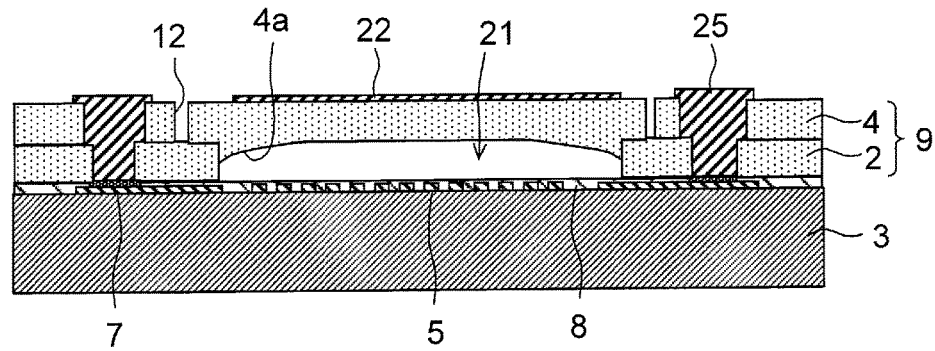

After that, by developing processing, as shown in FIG. 12 (a), the second through holes 34 linked to the first through holes 33 are formed, thereby completing the cover 9 constituted by the lid member 4 and the frame member 2. Because the illumination that exposes the regions T caused by scattered light is relatively weak, there is insufficient photoreaction in the regions T, so that the grooves 12 are formed. In FIG. 11(c), a method of not having the grooves 12 formed is to make the width of the light-blocking parts 39 opposite the regions T smaller than a prescribed dimension. This is because making the width of the light-blocking parts 39 smaller than a prescribed dimension causes exposure of the entire regions T, even by the weak exposure from the scattered light.

Next, a plating resist layer 41 is formed, as shown in FIG. 12 (b). This plating resist layer 41 is patterned so that there are apertures at parts in which the terminals 25 are to be formed and parts in which the reinforcing layer 22 is to be formed. Before forming the plating resist layer 41, a plating underlayer is formed on the upper surface of the lid member 4, the inner peripheral surfaces of the first through holes 33 and the second through holes 34, and the bottom surface of the first through holes. The deposition of the plating underlayer is done, for example, by sputtering.

Next, plating is done to form the terminals 25 and the reinforcing layer 22, as shown in FIG. 12 (c).

Specifically, first the plating is done with respect to the plating underlayer that is exposed from the plating resist layer 41, so as to grow plating. Then, the upper surface of the plating that has grown is planarized by CMP (chemical mechanical polishing) or the like, and the plating resist layer 41 is removed. This completes the terminals 25 and the reinforcing layer 22.

Although an appropriate method of plating may be selected, electroplating is preferable. This is because, with electroplating, the degree of freedom regarding the height of the pillar-shaped terminals 25 is high, and the intimacy of contact with the plating underlayer is good.

Finally, the insulating film 24 covering the reinforcing layer 22 is formed. The insulating film 24 can be formed, for example, by coating a negative-type photosensitive resin onto the upper surface of the cover 9 using spin coating or the like, and then exposing and developing this to perform patterning. The insulating film 24 may fill in the grooves 12. The above process steps complete the SAW device 301.

(Variation Example)

Figure 14:
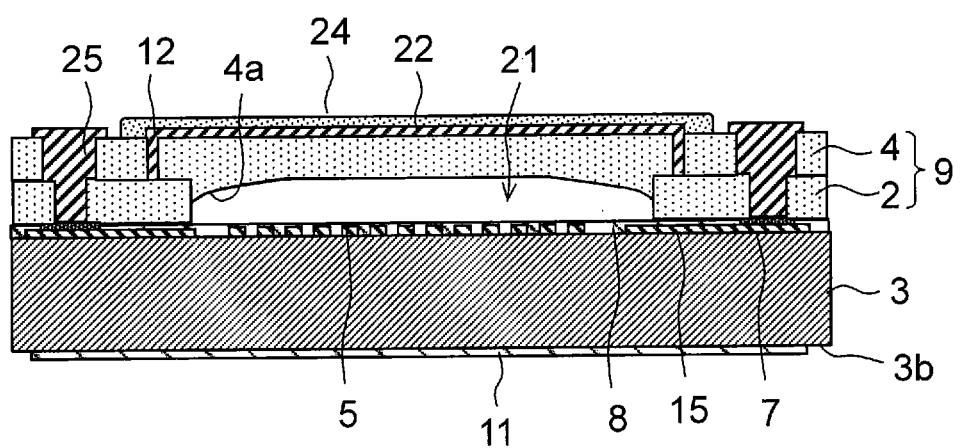
FIG. 14 is a cross-sectional view showing a variation example of the SAW device according to the fourth embodiment.

FIG. 14 is a cross-sectional view showing a variation example of the SAW device 301 in the fourth embodiment. In this variation example, the grooves 12 are formed on parts of the upper surface of the cover 9 that are positioned between the terminals 25 and the oscillation space 21 when the cover 9 is seen in plan view, and a part of the reinforcing layer 22 is seated into the grooves 12. Seating a part of the reinforcing layer 22 into the grooves 12 in this manner enables suppression of peeling of the reinforcing layer 22 from the cover 9. The grooves 12 for receiving the reinforcing layer 22 can be formed, for example, as shown in FIG. 11 (c), by exposure using a mask 40 in which light-blocking parts 39 are provided at positions at which the grooves 12 are to be formed.

<Fifth Embodiment>

Figure 15:
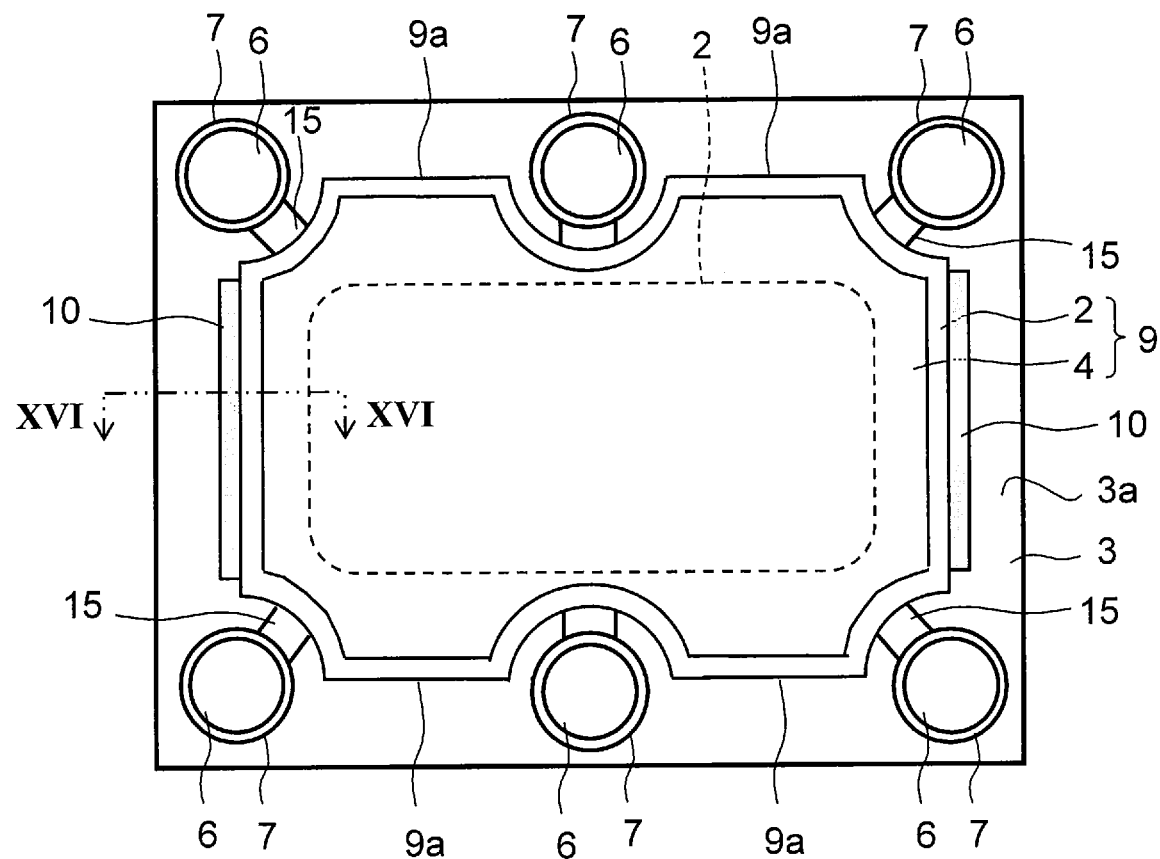
FIG. 15 is a plan view of an SAW device according to a fifth embodiment.

FIG. 15 is a plan view showing a SAW device 401 of the fifth embodiment. In FIG. 15, the outer periphery (inner wall 2a of the frame member) of the oscillation space 21 is shown as a dotted line.

The SAW device 401 has recessed parts 10 at prescribed locations in the main surface 3a of the element substrate 3. The recessed parts 10, as shown in FIG. 15, are provided so as to be exposed from the frame member 2 when seen plan view.

Figure 16:
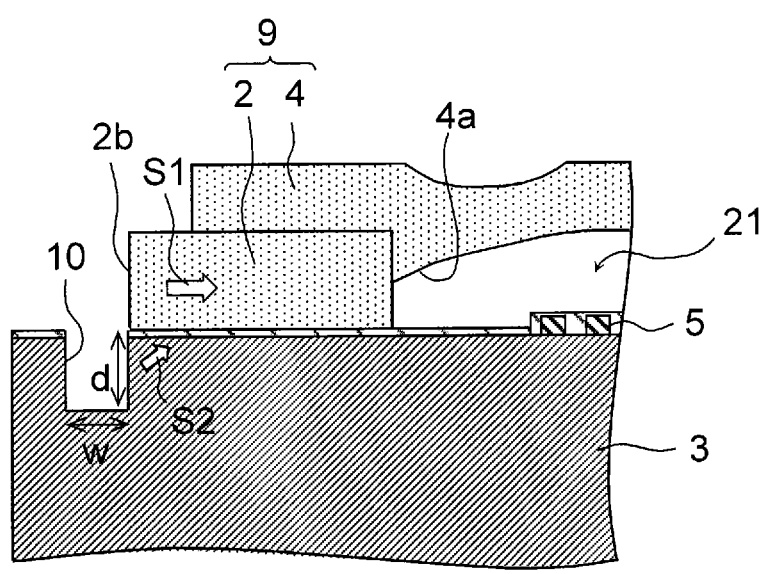
FIG. 16 is a partial cross-sectional view along line XVI-XVI in FIG. 15.

FIG. 16 is a partial cross-sectional view along line XVI-XVI of FIG. 15. In the SAW device 401, the recessed parts 10 are provided so that they just make contact with the outer wall 2b of the frame member when seen in plan view.

A verification was done by a simulation that providing such recessed parts 10 on the main surface 3a of the element substrate 3 can reduce stress concentrations applied to the cover 9 when, for example, the ambient temperature changes.

Figure 17:
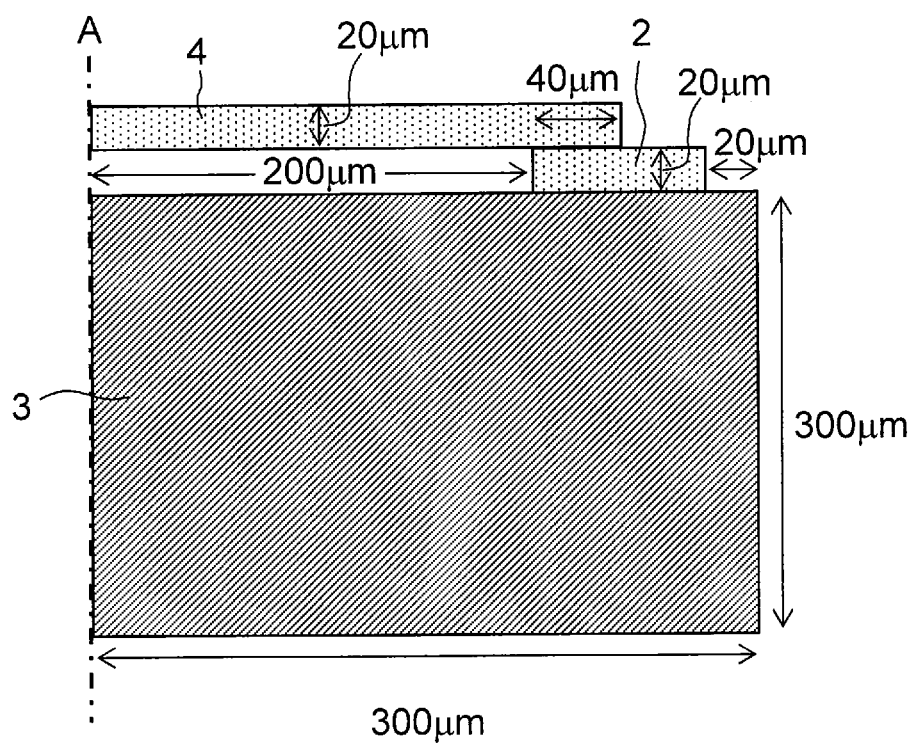
FIG. 17 is a cross-sectional view of a reference analysis model used in a simulation.
Figure 18A:
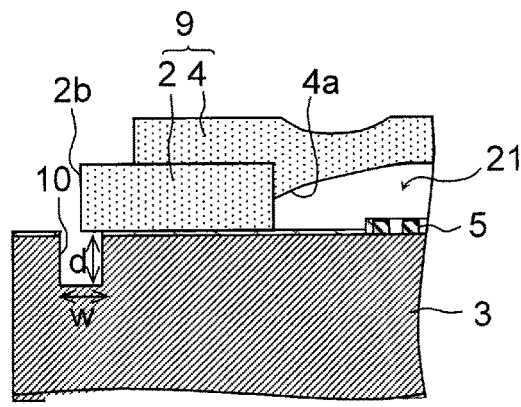
FIG. 18A to FIG. 18D are cross-sectional views of various analysis models used in a simulation.
Figure 18B:
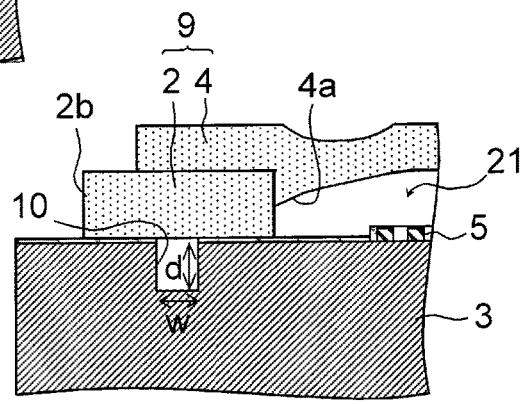
Figure 18C:
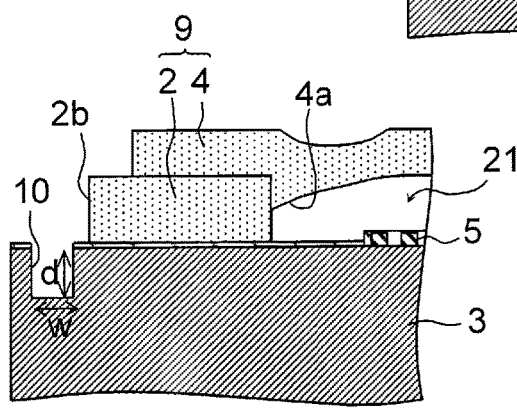
Figure 18D:
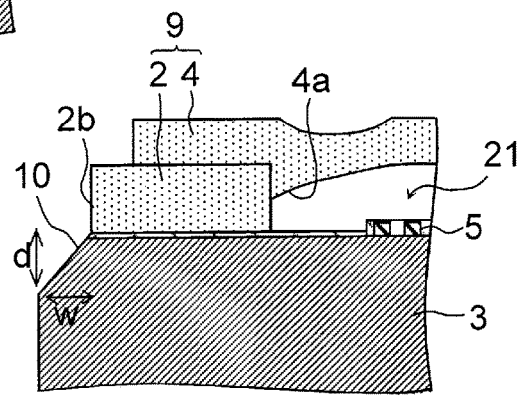

FIG. 17 is a reference analysis model S of an SAW device using that simulation. The reference analysis model S is a simplified modeling of an extracted part of a body with the axis of rotational symmetry A as the rotational axis. The material of the element substrate 3 was lithium tantalite, the thermal coefficient of expansion of the cover 9 at −40° C. was 38.5 ppm/° C. (actual measured value), and the thermal coefficient of expansion at 85° C. was 50 ppm/° C. (actual measured value. The dimensions of various parts are as shown in FIG. 17. The SAW devices in the reference analysis model S were analysis models A to E, with the formation of various recessed parts 10 and cutouts 13.

The analysis model A had recessed parts 10 formed in the reference analysis model S as shown in FIG. 16, the recessed parts 10 being formed in positions in contact with the outer wall 2b of the frame member 2. The analysis model B had recessed parts 10 formed in the reference model S as shown in FIG. 18 (a), with a part of the recessed parts 10 positioned below the frame member 2 and the remaining part exposed at the outside of the frame member 2. The analysis model C had recessed parts 10 formed as shown in FIG. 18 (b), with the entirety of the recessed parts 10 positioned under the frame member 2. The analysis model D had recessed parts 10 formed in the reference model S as shown in FIG. 18 (c), with the entirety of the recessed parts 10 exposed from the frame member 2. The analysis model E had formed in the reference analysis model S, not the recessed parts 10, but rather cutouts 13. The cutouts 13 were formed as cutouts starting at the point contact of the outer wall 2b of the frame member 2 with the main surface of the element substrate 3 and proceeding up to a corner on the element substrate 3 on the outer surface thereof.

With regard to each of these analysis models, a simulation investigation was done by finite element analysis of the maximum main stress applied to the cover 9 when the ambient temperature was changed from 85° C. to −40° C. The results are shown in Table 1. The dimensions of the depth d and the width w of the recessed parts 10 or cutouts 13 in each analysis model are also noted in Table 1.

TABLE 1

| Analysis Model | Dimensions (µm) | | Maximum Stress (MPa) | Comparison with Reference |
|---|---|---|---|---|
| | d | W | | |
| Reference | — | — | 57.8 | — |
| A | 12 | 12 | 56.8 | 98.3% |
| B | 10.5 | 20 | 53.3 | 92.2% |
| C | 12 | 4 | 68.0 | 117.6% |
| D | 17.5 | 56 | 57.0 | 98.6% |
| E | 40 | 20 | 56.8 | 98.3% |

As can be understood from the results shown in the table, with the exception of the analysis model C (that is, in the analysis models A, B, D, and E) the maximum main stress applied to the cover 9 was smaller than in the reference analysis model S. In contrast, in the analysis model C, the maximum main stress was larger than in the reference analysis model S.

In view of these results, it can be said that, in a region of the main surface 3a of the element substrate 3 that is to the outside of a part at a position at the lower edge of the inner wall 2a of the frame member 2 that delineates the oscillation space 21, when seen in plan view, by forming recessed parts 10 either having parts thereof that are positioned below the frame member 2 or being entirely positioned outside from the frame member 2, or by forming cutouts 13 that go from nearby the lower edge of the outer wall 2b of the frame member 2 and reach up to the side surface of the element substrate 3, the stress applied to the cover 9 when a large temperature change occurs can be reduced. Reducing the stress applied to the cover 9 in this manner can suppress peeling of the cover 9 from the element substrate 3.

Although the reason for being able to reduce the stress applied on the cover 9 by forming recessed parts 10 or cutouts 13 in this manner is not necessarily clear, one reason that can be envisioned is that this is due to relaxation of thermal stress. In a SAW device, if the element substrate 3 is formed from a piezoelectric maternal and the cover 9 is formed from a resin, because of the difference in coefficients of thermal expansion between the element substrate 3 and the cover 9, in response to a change in the surrounding temperature, thermal stress occurs in the cover 9. When this occurs, it can be envisioned that, if the recessed parts 10 such as shown in FIG. 16, for example, are provided, the element substrate 3 deforms somewhat in the direction of the white arrow S2, tracking the compression of the cover 9 (frame member 2) in the direction of the white arrow S1, resulting in a reduction of the thermal stress in the cover 9.

In the analysis model D shown in FIG. 18 (*d*), although the spacing between the frame member 2 side edges of the recessed parts 10 and the side wall 2*b* of the frame member 2 is 4 µm, if that spacing is made larger than 4 µm the effect of relaxing the stress caused by the cover 9 is reduced. Because of this, it is thought that, if the recessed parts 10 or the cutouts 13 are formed in proximity to the frame member 2, more specifically at the position at which at least the frame member 2 side edge is in contact with the frame member 2, it is possible to increase the effect of relaxing the stress.

Figure 19A:
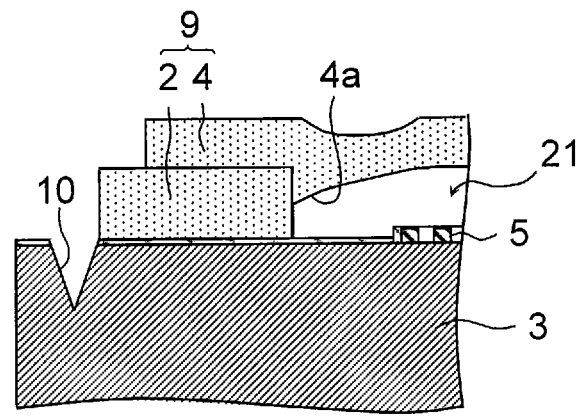
FIG. 19A to FIG. 19C are partial cross-sectional views showing various examples of the SAW device according to the fifth embodiment.
Figure 19B:
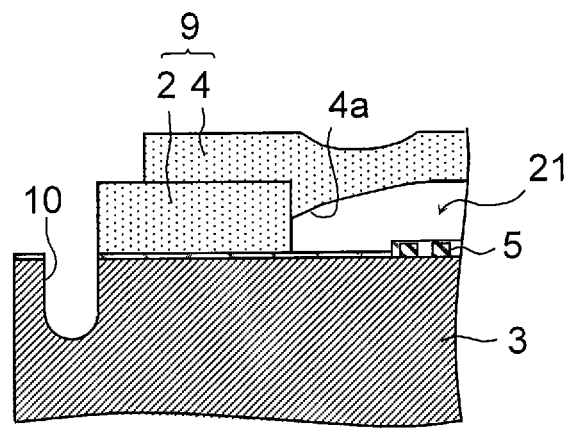
Figure 19C:
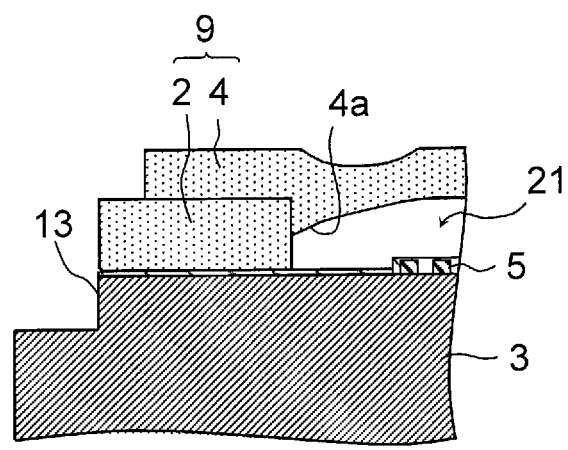

The cross-sectional shape of the recessed parts 10, as shown in FIG. 16 and FIG. 18 (*a*) to (*c*), is not restricted to being rectangular, and may be triangular shape, as shown in FIG. 19 (*a*), or may have an arc-shaped bottom, as shown in FIG. 19 (*b*). With regard to the cross-sectional shape of the cutouts 13 as well, this is not restricted to being the triangularly shaped cutout as shown in FIG. 18 (*d*), and may be, for example as shown in FIG. 19 (*c*), a rectangular shaped cutout.

Also, when the plan-view shape of the element substrate 3 is rectangular, such as shown in FIG. 15, a tendency is observed for cracks to easily occur in the frame member 2 at the short sides of the element substrate 3. Although the cause of this is unclear, one cause that is envisioned is that, because a large stress tends to be applied in the case of warping occurring at a short side of the element substrate 3, the compressive stress of the lid member 4 applied to that part causes cracks to occur with their point of origin at the edge of the lid member 4. Given this, it is thought that when the plan-view shape of the element substrate 3 is rectangular, if recessed parts 10 or cutouts 13 are formed on the short sides of the main surface 3*a* of the element substrate 3, as a result of the relaxation of stress applied to the frame member 2, it is possible to suppress the occurrence of cracking in the frame member 2.

Figure 20:
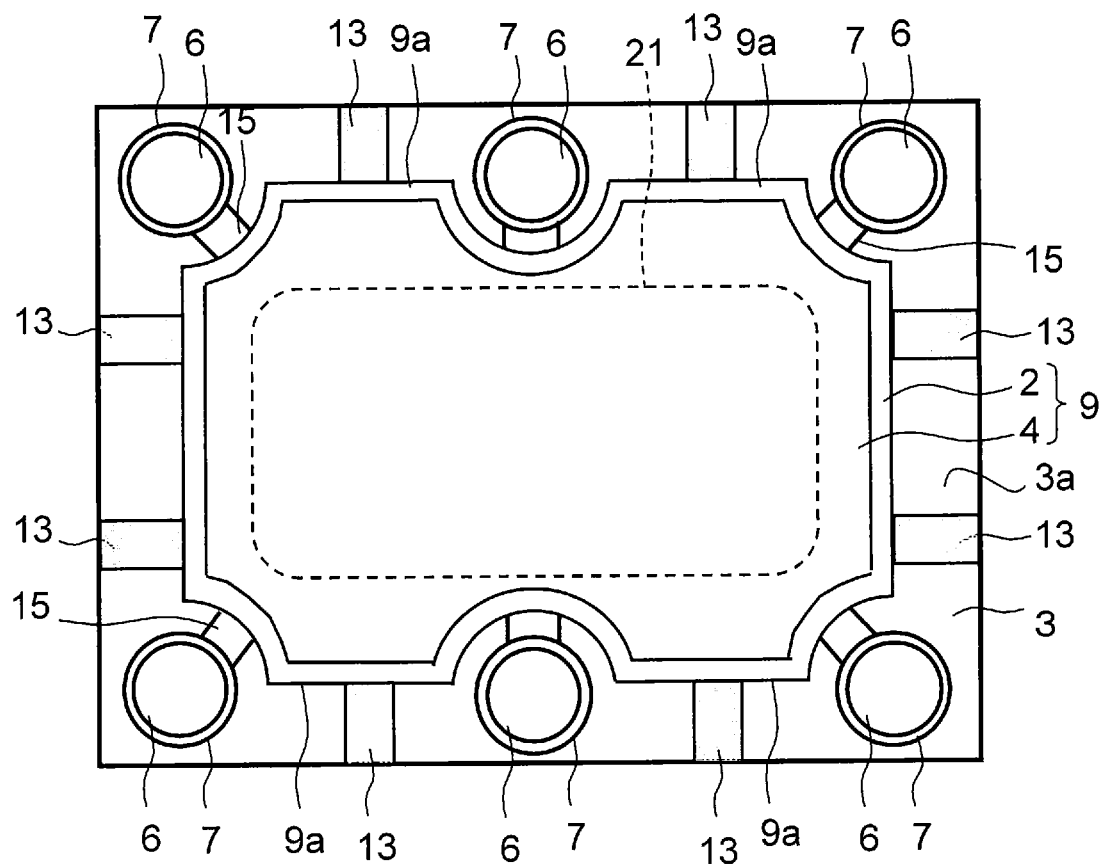
FIG. 20 is a plan view showing a variation example of the SAW device according to the fifth embodiment.

The position of forming the recessed parts 10 or the cutouts 13 is not restricted to those shown in FIG. 15. For example, as shown in FIG. 20, they may be formed on each side of the main surface 3*a*. Additionally, they may be formed in the shape of a frame along the outer periphery of the main surface 3*a* of the element substrate 3, and a mixture of both the recessed part 10 and the cutout 13 may be formed.

In the process of the above-described method for manufacturing a SAW device, such recessed parts 10 and cutouts 13 can be formed by using a dicing blade to cut into the main surface 3*a* of the element substrate 3 at the stage at which the protective layer 8 shown in FIG. 5 (*b*) is formed, at the stage at which the frame member 2 shown in FIG. 5 (*d*) is formed, or at the stage before the individual element substrates 3 are cut apart from the wafer-shaped aggregate of the element substrate 3 before FIG. 6 (*c*).

<Sixth Embodiment>

Figure 21:
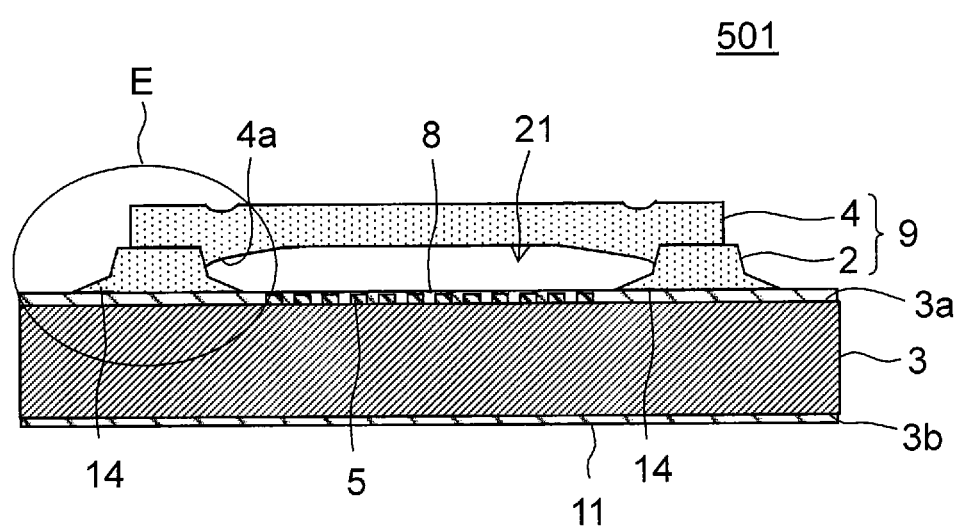
FIG. 21 is a cross-sectional view of an SAW device according to a sixth embodiment.
Figure 22:
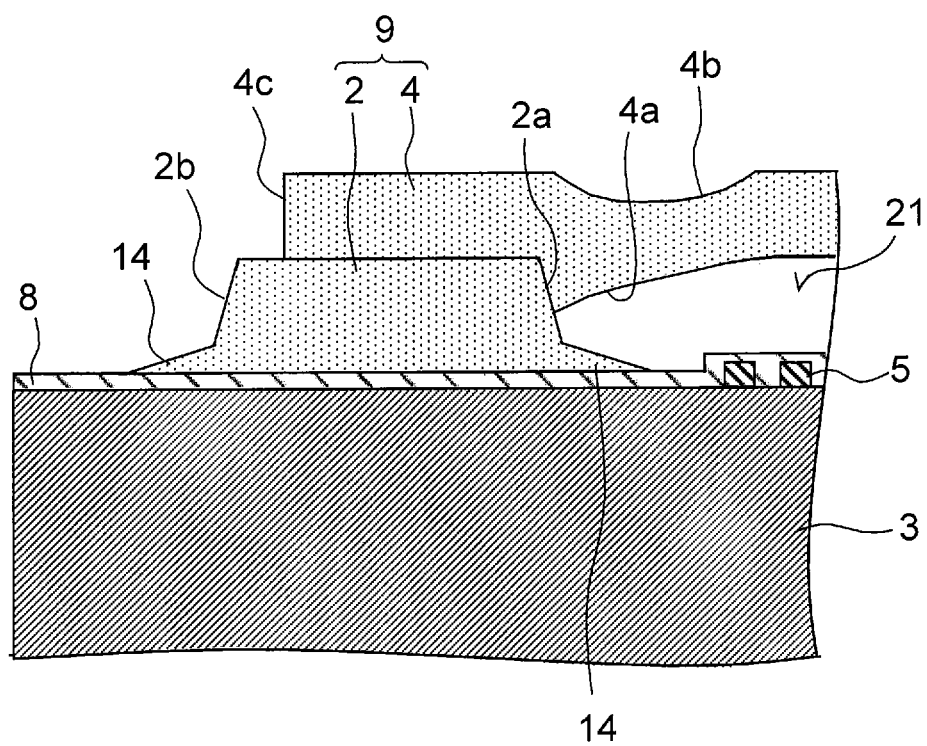
FIG. 22 is an enlarged view of region E shown in FIG. 21.

FIG. 21 is a cross-sectional view showing an SAW device 501 of the sixth embodiment, and FIG. 22 is an enlarged drawing of region E shown in FIG. 21.

The SAW device 501 in the sixth embodiment has an extending part 14 at the lower edge part of the cover 9 (frame member 2). The extending part 14 extends along the main surface 3*a* of the element substrate 3 on the part of the cover 9 joining with the outer surface side and the inner surface side of the element substrate 3. Stated differently, the extending part 14, on the side of the inner wall 2*a* of the frame member 2, extends from this inner wall 2*a* toward the oscillation space 21, and one the side of the outer wall 2*b* of the frame member 2, extends from the outer wall 2*b* toward the outer periphery of the element substrate 3. Also, although the extending part 14 is provided along the entire periphery of the lower edge part of the cover 9, it is not provided in the vicinity of the interconnects 15.

Because forming an extending part 14 such as this lengthens the path of intrusion of water and the like into the oscillation space between the cover 9 and the main surface 3*a* to the extent of the length of the extending part 14, it is possible to maintain the normal condition of airtightness of the oscillation space 21 over a long period of time. It is therefore possible to suppress corrosion of the excitation electrodes 5 and the like in the oscillation space, thereby enabling stabilization of the electrical characteristics of the SAW device 1 over a long period of time.

The extending part 14 is made of, for example, the same material as the cover 9, and formed integrally with the cover 9. If the extending part 14 is formed integrally with the cover 9, because it is possible to treat the contact surface area of the cover 9 with the main surface 3*a* as being increased to the extent of the extending part 14, the intimacy of contact of the cover 9 with the element substrate 3 is improved, enabling suppression of peeling of the cover 9 from the element substrate 3. The extending part 14 may be made from a different material than the cover 9.

From the standpoint of lengthening the path of intrusion of water and the like from the outside, enlargement without changing the width of the frame member 2 can be envisioned. However, because it is necessary to keep such a thick element as the frame member 2 a prescribed distance from the excitation electrodes 5 and the element substrate 3, simple enlargement is not possible. Because a large object such as the thick frame member 2 coming into contact with the excitation electrodes 5 greatly influences the oscillation of the excitation electrodes 5, leading to a deterioration of the electrical characteristics, at the outer peripheral side of the element substrate 3, because that part is the wafer dicing line, if a thick frame member 2 exists over the dicing line chipping tend to occur in the element substrate 3 and the like at the time of wafer dicing. Additionally, if the SAW device 501, as will be described later, is mounted to another mounting substrate and the overall SAW device 501 is covered with an outer resin material, if the outer wall of the cover 9 comes up the vicinity of the outer periphery of the element substrate 2, it becomes difficult for the outer resin material to enter between the SAW device 1 and the main surface of the mounting substrate, and the problem occurs of a gap forming in that part.

With respect to this, because the extending part 14 is formed thinly to extend from the lower edge of terminal cover 9, even should the extending part 14 come into contact with the excitation electrodes 5 or extend up to the vicinity of the outer periphery of the element substrate 3, the above-noted problem can be suppressed. In particular, if the extending part 14 is formed so that it gradually becomes thinner as it approaches toward the outside, even if its end comes into contact with the excitation electrodes 5, it does not have that great an effect on the electrical characteristics, and even should it extend to the vicinity of the outer periphery of the element substrate 3, it is possible to effectively suppress the occurrence of chipping of the element substrate 3 and the like at the time of wafer dicing. It is additionally possible to suppress the formation of a gap between the SAW device 1 and a mounting substrate in the case in which the SAW device 501 is mounted to another mounting substrate and as covered by an outer resin material. The thickness of the thickest part of the extending part 14, that is, the thickness of the part connecting to the cover 9 is, for example, 1/30 to 1/10 the thickness of the frame member 2. Specifically, if the thickness of the frame member 2 is 30 μm, the size of the thickest part of the extending part is 1.5 μm. The width of the extending part 14 in the horizontal direction is, for example, approximately 40 μm.

The cross-sectional shape of the extending part 14 is not restricted to the triangular shape shown in FIG. 22, and may have an outer periphery that is arc-shaped, trapezoidal, or rectangular shaped or the like.

<Seventh Embodiment>

Figure 24A:
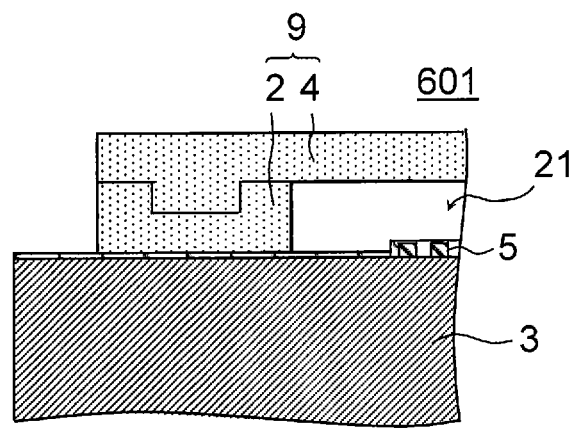
FIG. 24A to FIG. 24C are enlarged cross-sectional views showing an SAW device according to a seventh embodiment.
Figure 24B:
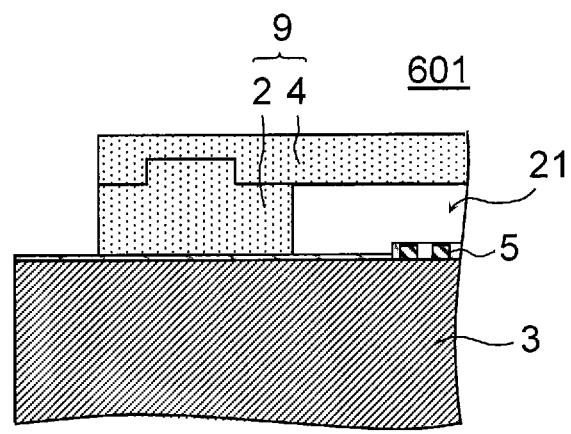
Figure 24C:
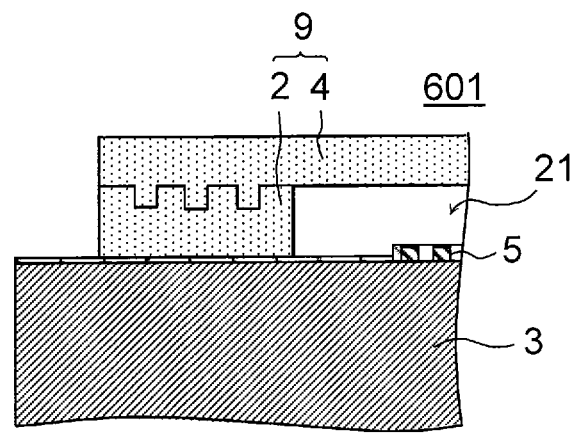

FIG. 24 (a) to FIG. 24 (c) show an SAW device 601 of the seventh embodiment, these being enlarged cross-sectional views of the part corresponding to FIG. 3.

Every SAW device 601 shown in FIG. 24 (a) to FIG. 24 (c) has protruding and recessed parts formed in the upper surface of the frame member 2, and protruding and recessed parts that mate with the protruding and recessed parts formed in the frame member 2 are formed in the lower surface of the lid member 4, so that when the lid member 4 is placed over the frame member 2, the protruding and recessed parts of the lid member 4 mate with the protruding and recessed parts of the frame member 2.

Because forming such protruding and recessed parts in the frame member 2 and the lid member 4 increases the contact surface area between the lid member 4 and the frame member 2 in the same manner as the descending part 4a in the above-described SAW device 1 of the first embodiment, in addition to enabling suppression of peeling between the lid member 4 and the frame member 2, it enables suppression of the intrusion of water from outside into the oscillation space 21.

To form a relatively large recessed part in the upper surface of the frame member 2 as shown in FIG. 24 (a), for example, dry etching or wet etching can be done to the upper surface of the frame member 2, at the stage at which the frame member 2 is formed (FIG. 5 (d)).

To form a relatively large protruding part in the upper surface of the frame member 2 as shown in FIG. 24 (b), for example, the frame member 2 may be made a two-layer structure. Specifically, photolithography or the like is used to form the first layer in the same manner as in the case in which a normal frame member 2 is formed, to form the first layer that is below the protruding part (FIG. 5 (d)), after which photolithography or the like is used to form second layer that will become the protruding part on the first layer.

To form relatively small protruding and recessed parts on the upper surface of the frame member 2 as shown in FIG. 24 (c), for example, ashing is done to the upper surface of the frame member 2 using oxygen plasma or the like, at the stage at which the frame member is formed (FIG. 5 (d)).

The protruding and recessed parts of the lid member 4 that mate with the protruding and recessed parts formed on the upper surface of the frame member 2 can be formed, for example, at the stage at which the thin film that will become the lid member 4 is attached to the frame member 2 (FIG. 6 (a)), by setting such prescribed conditions as the rotational speed of the roller 30 and the temperature of the stage 29.

Although FIG. 24 (a) to FIG. 24 (c) show examples in which the cross-sectional shapes of the protruding and recessed parts are rectangular, the cross-sectional shapes of the protruding and recessed parts are not restricted to being rectangular, and can be arbitrary shapes, for example, triangular, trapezoidal, or arc-shaped. The depth of the recessed parts (height of the protruding parts) of the protruding and recessed parts, in the case such as in FIG. 24 (a) and FIG. 24 (b), in which relatively large protruding and recessed parts are formed, is, for example, 10% to 60% of the thickness of the frame member 2, specifically, 1 μm to 20 μm. In the case such as in FIG. 24 (c), in which relatively small protruding and recessed parts are formed, it is possible to treat the upper surface of the frame member 2 as a surface that has been roughened, with the arithmetic average roughness of the roughened upper surface of the frame member 2 (arithmetic average roughness when measured by a laser microscope) being 0.5 μm to 2 μm.

The protruding and recessed parts formed on the upper surface of the frame member 2 may be formed so as to be dispersed uniformly over the upper surface of the frame member 2 when the frame member 2 is seen in plan view, and the recessed parts may be formed as a continuous groove along the upper surface of the frame member 2.

The SAW device 1 of the first embodiment can also be viewed as being in a configuration in which frame member side protruding and recessed parts formed on the upper surface of the frame member 2 and the protruding and recessed parts formed on the lower surface of the lid member 4 are mated together. That is, the formation of the descending part 4a on the lid member 4 can be viewed as a relatively large recessed part formed on the lower surface of the lid member 4, with a protruding part mating therewith being formed on the upper surface of the frame member 2.

The present invention is not restricted to the above embodiments and may be embodied in various forms, and the above-described embodiments may be combined as appropriate. For example, with respect to an SAW device 1 of the first embodiment in which the descending part 4a is formed, protruding and recessed parts may be formed on the upper surface of the frame member 2 as in the SAW device 601 of the sixth embodiment, and protruding and recessed parts that mate with the protruding and recessed parts of the frame member 2 may be formed on the lower surface of the lid member 4.

The acoustic wave device is not restricted to being an SAW device, and may be, for example, a piezoelectric thin-film resonator.

Additionally, in the acoustic wave device, the protective layer 8 and the rear surface part 11 are not essential restrictions and may be omitted.

DESCRIPTION OF REFERENCE NUMERALS

1 Acoustic wave device
2 Frame member
3 Element substrate
4 Lid member
4a Descending part
5 Excitation electrode
6 Connection-enhancement layer
7 Pad
9 Cover
10 Recessed part

The invention claimed is:
1. An acoustic wave device comprising:
an element substrate;
excitation electrodes disposed on the element substrate;
a frame member disposed on the element substrate and surrounding the excitation electrodes; and a lid member disposed on a top surface of the frame member and sealing a space formed by the element substrate and the frame member, a height of the top surface of the frame member above the excitation electrodes being substantially equal to a height of a bottom surface of the lid member above the excitation electrodes, wherein the frame member has an inner wall facing the space and an outer wall opposite to the inner wall, and wherein the lid member comprises a first surface facing the element substrate, and a descending part extending away from the first surface toward the element substrate and contacting at least a part of the outer wall, the descending part being integrally formed with the lid member, the lid member being formed as a single integral structure.

2. The acoustic wave device according to claim 1, wherein the outer wall is inclined so as to spread progressively outward toward the element substrate.

3. The acoustic wave device according to claim 2, further comprising a sealing film that covers at least from the outer wall of the frame member to a side wall of the lid member.

4. The acoustic wave device according to claim 1, further comprising:
a reinforcing layer composed of metal and disposed on the lid member;
pads disposed on the element substrate at which the lid member overlaps with the frame member, and electrically coupled to the excitation electrodes; and
terminals extending from each of the pads, respectively, and passing through the frame member and the lid member, and exposed at an upper surface of the lid member.

5. The acoustic wave device according to claim 1, further comprising a reinforcing layer composed of metal and disposed on the lid member, the outer periphery of the reinforcing layer being disposed on the frame member.

6. The acoustic wave device according to claim 1, further comprising:
pads disposed on the element substrate and electrically coupled to the excitation electrodes; and
terminals extending from each of the pads, respectively, and passing through the frame member and the lid member,
wherein the descending part is positioned in a cross-sectional plane where the terminals are positioned.

7. The acoustic wave device according to claim 1, wherein the element substrate comprises a main surface, a side surface, and a cutout extending from the main surface at a vicinity of a lower edge of the outer wall toward the side surface.

8. The acoustic wave device according to claim 1, further comprising an insulating film disposed on the lid member.

9. An acoustic wave device comprising:
an element substrate;
excitation electrodes disposed on the element substrate;
a frame member disposed on the element substrate and surrounding the excitation electrodes, and
a lid member disposed on a top surface of the frame member and sealing a space formed by the element substrate and the frame member, a height of the top surface of the frame member above the excitation electrodes being substantially equal to a height of a bottom surface of the lid member above the excitation electrodes, wherein the frame member has an inner wall facing the space, and wherein the lid member comprises a first surface facing the element substrate, and a descending part extending away from the first surface toward the element substrate and contacting at least a part of the inner wall, the descending part being integrally formed with the lid member, the lid member being formed as a single integral structure.

10. The acoustic wave device according to claim 9, wherein the frame member has an outer wall opposite the inner wall, the outer wall being inclined so as to spread progressively outward toward the element substrate.

11. The acoustic wave device according to claim 10, further comprising a sealing film that covers at least from the outer wall of the frame member to a side wall of the lid member.

12. The acoustic wave device according to claim 9, further comprising:
a reinforcing layer composed of metal and disposed on the lid member;
pads disposed on the element substrate at which the lid member overlaps with the frame member, the pads being electrically coupled to the excitation electrodes; and
terminals extending from each of the pads, respectively, and passing through the frame member and the lid member, and exposed at an upper surface of the lid member.

13. The acoustic wave device according to claim 9, further comprising a reinforcing layer composed of metal and disposed on the lid member, the outer periphery of the reinforcing layer being disposed on the frame member.

14. The acoustic wave device according to claim 9, further comprising:
pads disposed on the element substrate and electrically coupled to the excitation electrodes; and
terminals extending from each of the pads, respectively, and passing through the frame member and the lid member,
wherein the descending part is positioned in a cross-sectional plane where the terminals are positioned.

15. The acoustic wave device according to claim 9, wherein the element substrate comprises a main surface, a side surface, and a cutout extending from the main surface at a vicinity of a lower edge of the outer wall toward the side surface.

16. The acoustic wave device according to claim 9, further comprising an insulating film disposed on the lid member.

* * * * *